United States Patent [19]
Baisuck et al.

[11] Patent Number: 5,299,139
[45] Date of Patent: Mar. 29, 1994

[54] SHORT LOCATOR METHOD

[75] Inventors: Allen Baisuck, San Jose, Calif.; William W. Hoover, III, Ballston Lake, N.Y.

[73] Assignee: Cadence Design Systems, Inc., San Jose, Calif.

[21] Appl. No.: 718,969

[22] Filed: Jun. 21, 1991

[51] Int. Cl.$^5$ .............................................. G06F 15/60
[52] U.S. Cl. ................................. 364/491; 364/490; 364/489; 364/488
[58] Field of Search ................ 364/488, 489, 490, 491

[56] References Cited
U.S. PATENT DOCUMENTS

| | | | |
|---|---|---|---|
| 3,617,714 | 11/1971 | Kernighan | 364/488 |
| 4,651,284 | 3/1987 | Watanabe et al. | 364/491 |
| 5,062,054 | 10/1991 | Kawakami et al. | 364/491 |

OTHER PUBLICATIONS

"Programs for Verifying Circuit Connectivity of MOS/LSI Mask Artwork" by Takashima et al; IEEE 19th Design Automation Conf., 1982, pp. 544-550.
"EXCL: A Circuit Extractor for IC Designs" by McCormick, IEEE 21st Design Automation Conf., 1984, pp.616-623.

Primary Examiner—Vincent N. Trans
Attorney, Agent, or Firm—Kenneth M. Kaslow; Phong K. Truong; Dennis S. Fernandez

[57] ABSTRACT

An improved circuit layout-verifying system and method operates on a plurality of polygons that are representative of an electrical node to test the proper or improper connection of each polygon to another contiguous polygon and designates for display those polygons that represent improper connections between known or identified reference points on the node. Traversals along a sequence of contiguous polygons between known reference points on the same electrical node are designated as proper connections or successes, and traversals along a sequence of contiguous polygon between reference points associated with different electrical nodes are designated as improper connections or failures at least along a portion of the sequence. Data from all traversals of all polygons from all known reference points is then analyzed to remove unambiguous sequences of polygons for the improperly connected electrical nodes. High resolution analysis is performed on large, single electrical nodes by selectively breaking down the node into subpolygons that can be analyzed in the previous manner.

7 Claims, 24 Drawing Sheets

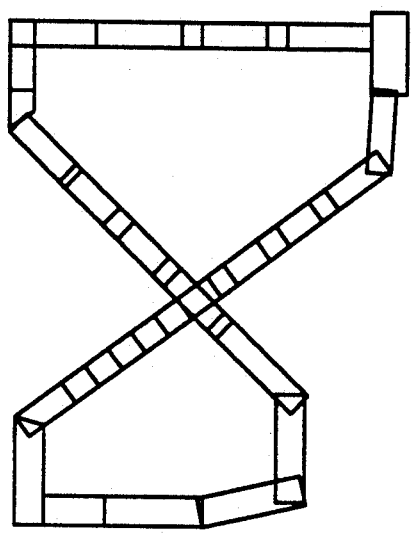
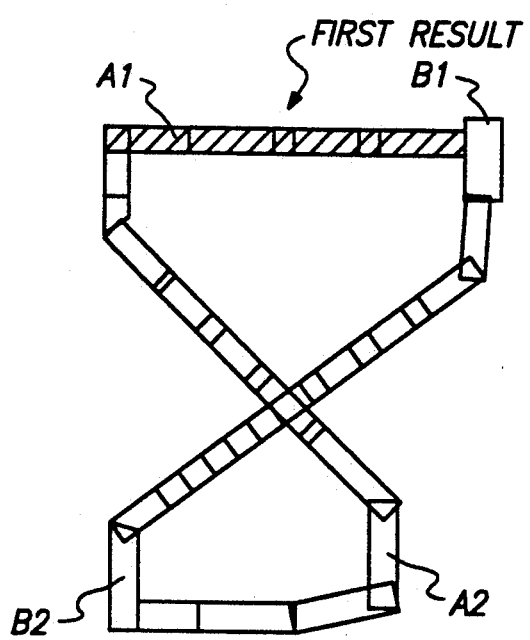
FIG. 5A          FIG. 5B
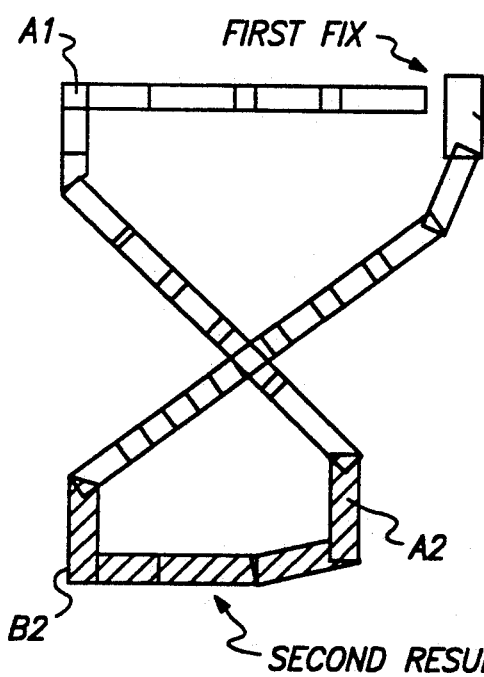
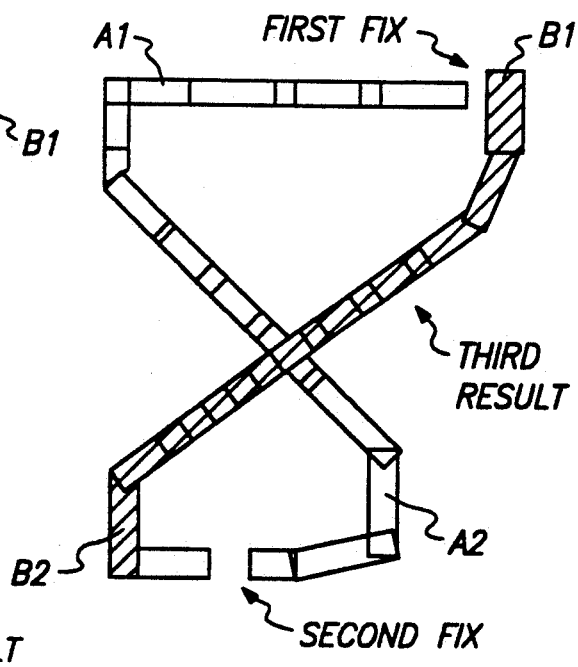
FIG. 5C          FIG. 5D

SHORT LOCATOR METHOD

FIELD OF THE INVENTION

This invention relates to error detection schemes for integrated circuit (IC) layout, and more particularly to the method and apparatus for detecting layout design errors that constitute a "short circuit" error in which the layouts of polygons representing conductive materials touch in places where they should not touch, thereby creating connections between circuit elements which should not be connected.

BACKGROUND OF THE INVENTION

When "circuit extraction" programs are applied to an IC layout design database, the result is a representation of the electrical circuit which would result from committing that layout design to a mask set and fabricating integrated circuit chips using that mask set. While their internal representations differ, all circuit extraction programs must, at one point, determine all disjoint sets of polygons representing areas of equipotential in the final, fabricated IC, i.e., they must determine all electrical nodes represented in the design database.

If polygons representing the same conductive material touch or overlap each other, then they represent an electrical node. Similarly, if polygons representing different conductive materials are shown to be "connected" by either proximity or so-called "contact" materials, then they, too, represent an electrical node. The polygons that comprise an electrical node may be formed or represented for analysis purposes in any one of several ways that are commonly known in the art. Incorrect placement of conductive or contact materials results in the connection of one node to another, and if only geometric information is available to the programs analyzing the layout information, then it is typically not possible to precisely locate the position of the incorrectly placed polygon(s). As an example, FIG. 1 represents a node comprised of polygons 1,2,3,4 and 5. It is not possible to tell that it is, in fact, formed of two nodes, A and B as shown in FIG. 2, shorted together by the polygon labelled "3".

Certain known software routines that are commercially available assist in identifying layout errors causing electrical nodes to be incorrectly connected. In one software routine the shortest conductive path is formed between two points (on an electrical node) selected by the user from the "extracted network". This path is displayed, and the task of the user is to determine the incorrect polygon(s) which caused the points to connect. FIGS. 1-3 represent an example of the type of problem solved by this technique. Specifically, in FIG. 1, an electrical node comprised of 5 polygons (numbered 1-5) are extracted from the layout. The polygon 3 was placed in error to connect nodes A and B, as shown in FIG. 2. When the user operates the program to display the short between the two points A and B, polygons 2, 3, and 4 are highlighted, and the user's job is then to determine that polygon 3 is incorrectly placed. The conventional program determines all paths (shorts) among the different nodes identified by the user. They may all be displayed simultaneously or in the order of increasing "length" (i.e., the number of polygons or trapezoids comprising them). FIGS. 5B-D show the sequence of displays which would result from a user's effort to separate the two nodal components of the "figure-eight" node shown in FIG. 5A. FIG. 5E shows the initial result of conventional program operation to locate the shorts and display all paths that are found simultaneously.

Another known software routine "prunes" from the extracted node under analysis (the "problem node") all non-ambiguous branches. The extracted node in FIG. 1 comprises polygons 1-5. If the user indicates that, as in FIG. 3, point (a) corresponds to A POINT ON NODE A, and that point (b) corresponds to A POINT ON NODE B, then the ambiguity of the node can be reduced to the area shown in FIG. 4 as "?" because the polygons 1,2,4 and 5 can be "pruned" away since they are now known to no longer belong to ambiguous branches of the problem node. The remaining area is (in this trivial example) sufficiently simple for the user to determine the cause of the short. If not, then the user may enter additional points of correspondence to further reduce the ambiguity of the problem node in the manner previously described. Such known programs for operation on conventional main frame and workstation computers are available from Cadence Design Systems, Inc. of San Jose, Calif.

One disadvantage encountered with each of the aforementioned programs is that insufficient information is provided to the user to quickly "home-in" on the error, unless the node is extremely simple (such as in the example), or unless the user's placement of known nodal points is fortuitous. Another difficulty encountered is that these known programs do not deal effectively with the typical case in which multiple nodes are shorted in multiple locations, and the only points easily available to the user are at or near the connection pads of the chip. Nodes such as those delivering power to a chip, or clock lines, or ground, can be extremely large and complex, comprising thousands, hundreds of thousands, or (in future chips) millions of individual polygons. Two or more of such nodes may be shorted together in more than one place, exacerbating the problem. Indeed, any number of nodes may have inadvertently been shorted together in any number of places, thus creating a problem that is difficult to solve without a major advancement in analysis techniques.

SUMMARY OF THE INVENTION

The present invention utilizes a new identification scheme for the "shorted"or "ambiguous" part of the extracted node being analyzed. Conventional processing prepares a representation of the problem node in a circuit layout as a series of abutting or overlapping (or otherwise connected) polygons. Then, the short locator method of the present invention traces the node multiple times, using different reference or "correspondence point" information associated with different circuit nodes (typically supplied by a user) during each tracing of the network, and retains what it derives from each tracing. As the tracings are performed, the derived information is combined, and at the end of all tracings, a display is produced for the user which separates the "known" from the "ambiguous" parts of the problem node. In accordance with the present invention the nodal network is traversed in one of three modes; namely: "search", "success", or "failure" modes, and a marker is left in each polygon "visited" to indicate the mode the system was in when the visit occurred. During the traversal, which starts at each of the correspondence points whose nodal identity is supplied by the user, the method "searches" for "success" or "failure".

"Success" means that another polygon marked with the same identification as the mark of the starting point has been found. "Failure" means that a polygon with a mark different from that of the starting point has been found along the same node. When the traversal is in the "forward" direction (exploring unvisited polygons), operation is in "search" mode. Traversal may be in the "backward" direction (because either success or failure was encountered), either in "success" or "failure" mode, depending on the nature of the encounter. Backward traversal terminates as soon as an alternative forward path is found (e.g., at a junction). Operation then reverts to "search" and the forward traversal continues.

When the entire problem node has been traversed from all instances of the first node-identifier supplied by the user, the mode-markings for each polygon in the node are not discarded. Rather, the traversal for the next identified node is performed, and the mode-markings are combined with the existing ones for each polygon in the problem node according to the following set of rules:

a. If an entry was already "success", change it to "ambiguous" if the new entry is "success".

b. If an entry was already "success", do not change it if the new entry is "failure".

c. If an entry was already "failure", do not change it if the new entry is "failure".

d. If an entry was already "failure", change it to "success" if the new entry is "success". At the completion of processing of all different correspondence points for identified nodes supplied by the user, then "failure" in any polygon is checked and is changed to "ambiguous" for display. Thus, as illustrated in FIG. 5F, the short would be displayed or otherwise indicated to be the shaded area when correspondence points A1, A2, B1, and B2 are entered by the user.

DESCRIPTION OF THE DRAWINGS

FIGS. 5 E-F are pictorial representations of the circuit node of FIG. 5A analyzed differently for error connections to identified circuit nodes;

FIG. 5 G is a pictorial representation of the circuit node of FIG. 5A for analysis according to the process of the present invention;

DESCRIPTION OF THE PREFERRED EMBODIMENTS

Definitions

Figure 6:
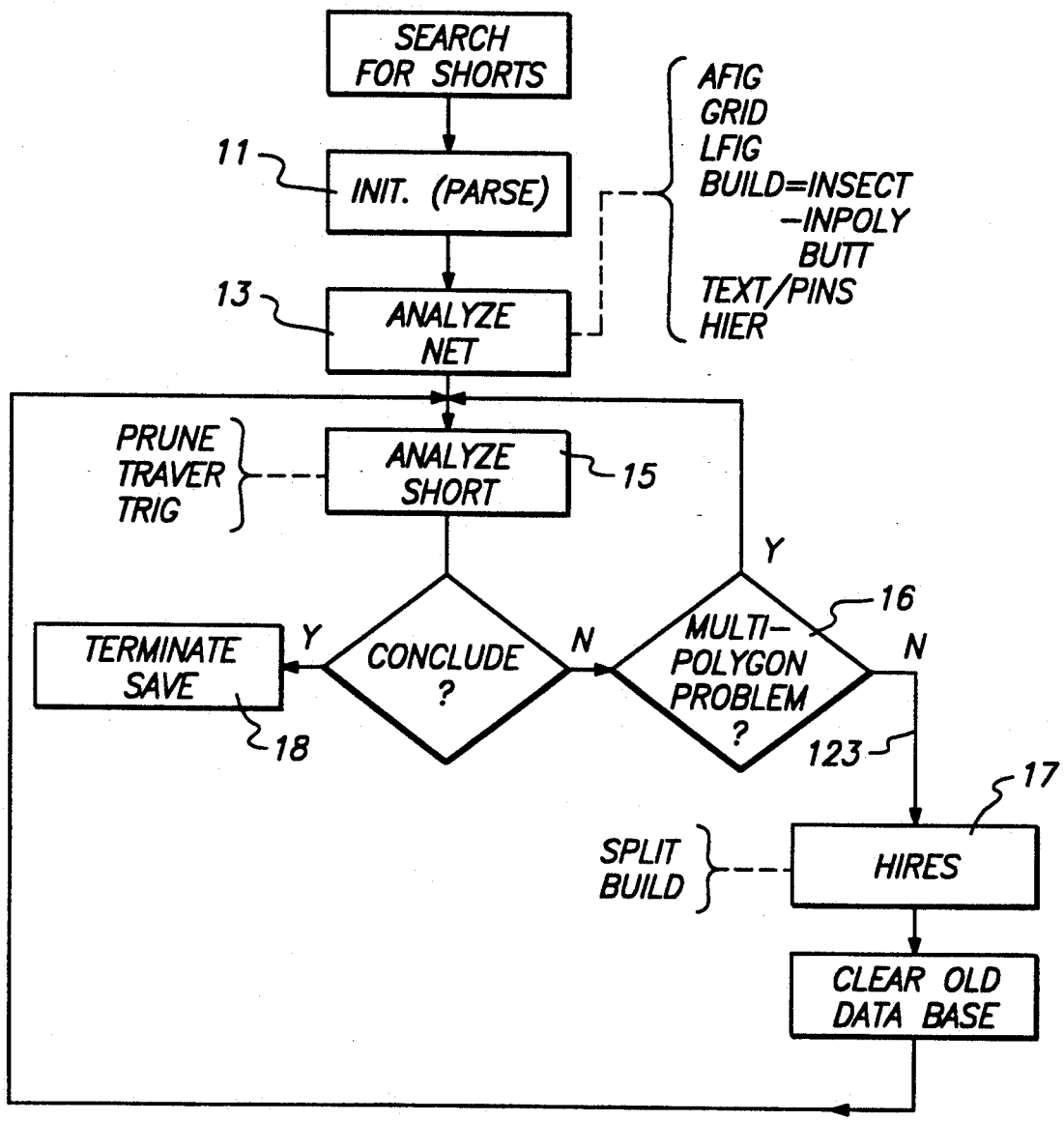
FIG. 6 is a graph illustrating the sequence of steps of the present invention that are performed on a circuit layout.

In accordance with one embodiment of the method of the present invention, the method for locating erroneous connections is performed on conventional mainframe and workstation computer equipment (such as SPARK Stations commercially available from Sun Microsystems) in accordance with the programmed routine illustrated in FIG. 6. In general, the method of the present invention relies upon several premises associated with contemporary integrated circuit designs, including: one or more polygons of connected conductive material form an equipotential node; butting polygons on the same layer are assumed connected by a contact; a "terminal" is an imaginary lead which connects a contact to a polygon; and a contact which connects N polygons together has N "terminals".

Similarly, there are several design axioms of interest, including a contact attached to only one polygon may be ignored; and, all things in the initial problem node are connected.

In the method of the present invention, an appropriate data structure is prepared using conventional computer programs to represent an equipotential node (e.g., clock, ground, power nodes) as a series of polygons for traversal of such node in a problem node under analysis. In the data structure, each contact is represented as having a number of terminals equal to the number of layers it connects. The data structure includes three types of data "beads" representing the connectivity of the short itself, namely: contact; terminal; and net. Contact beads correspond to contacts in the circuit; terminal beads correspond to the imaginary "terminals" possessed by each contact; and net beads correspond to the individual polygons on interconnect layers found in the short to be analyzed. There is one net bead per polygon (including individual beads for two or more polygons which butt on a single layer), and one contact bead per contact. Contacts which connect more than two layers are represented as having more than two terminals.

Each contact "bead" (data structure) is a member of a linked list of all contact beads in the problem node. It contains a pointer to the geometric figure it represents in memory; and contains the head of a linked list of terminals connected to it. It also contains the number of terminals it, itself, possesses, as well as two "status" fields describing the program's assessment of the contact's contribution to the short circuit. Just how this assessment is made is detailed in subsequent discussion herein of the program's operation, in which the "traversal" of the problem node is described. One field is used repeatedly for each such traversal, and one is for storing the cumulative status from all traversal passes. The contact bead further contains three flags that are used during processing: a "visited" flag, a "pruned" flag, and a "displayed" flag. There is also a back pointer that is used during problem node traversal to point to "the net we came from" during the traversal.

Each net bead is a member of a linked list of all net beads in the problem node. It contains a pointer to the corresponding geometric figure in memory, namely, a single one of the polygons comprising the problem node's structure. It contains the head of a linked list of terminals connected to the net being represented, as well as a "connectivity counter", which contains the number of connections to that net. Each net bead also contains two status fields describing the program's assessment of the net's contribution to the short circuit, one used during each traversal and one for maintaining the cumulative status of all traversals, as detailed in subsequent discussion herein. It contains three flags that are used during processing: a "visited" flag, a "pruned" flag, and a "displayed" flag. There is also a back pointer that is used during problem node traversal to point to the "contact we came from" during the traversal process.

Each terminal bead contains the linked list pointers to the next terminal in the chain of terminals on a contact and the chain of terminals on a net. It also has pointers to the net and contact beads with which it connects. It contains two flags used during processing: a "taken" flag, and a "pruned" flag.

Operation

In operation, the user provides information about known nodes and, for each different type or name of node, all polygons (nets) with that name are found and labelled in a status flag field of the appropriate net beads. The code "1" is used for first text name, "2" is used for second text name, and so on, throughout the N different names entered by the user. In this embodiment, the actual value used is "Success+N" since the value is stored in the same location as the traversal status. In order to reduce ambiguities in locating the short circuits on the node, the user enters correspondence or reference points that are known to be associated with one or other different electrical nodes. The objective is to traverse a series of connected polygons that form an electrical node being analyzed, commencing at one known reference point to terminate at another known reference, while storing the results for each polygon visited. A traversal between known reference points of the same node is designated as a "success" over that portion of the node, and at least some portion of a traversal that starts at a known reference point for the node being analyzed and terminates at a reference point for a different node is designated as a "failure" requiring further analysis. Success paths of polygons forming the node are generally unambiguous and normally do not require further analysis, while failure paths of polygons forming the node constitute ambiguities that require further analysis with the help of the user.

Figure 1:
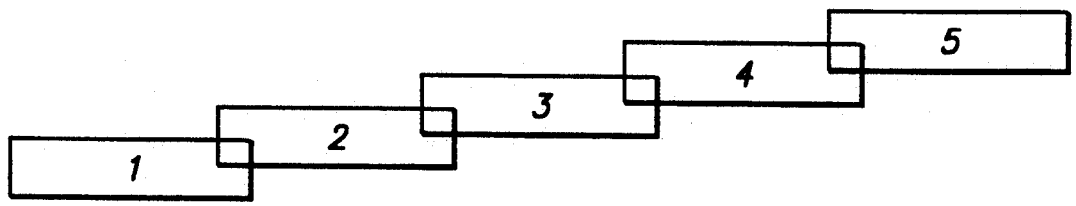
FIG. 1 is a pictorial representation of a plurality of conductive polygons forming an exemplary circuit node.
Figure 2:
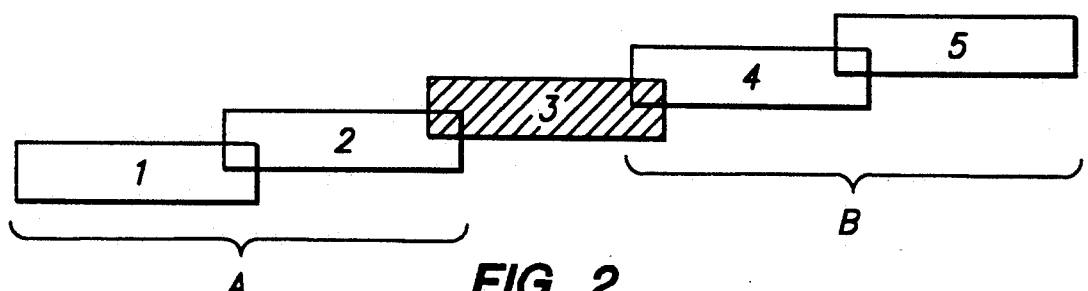
FIG. 2 is a pictorial representation of the circuit node of FIG. 1 illustrating conductive connection between separate nodes.
Figure 3:
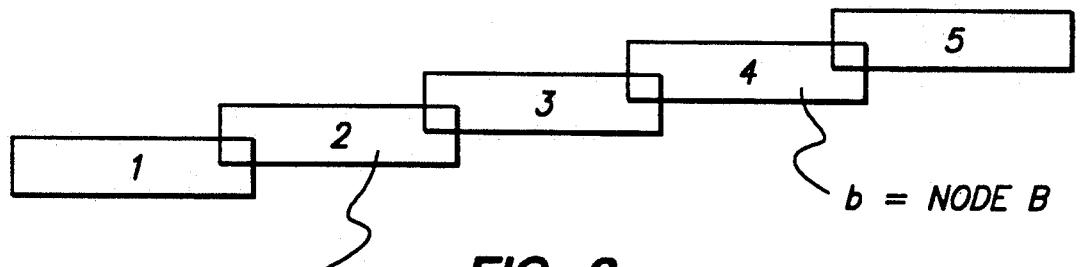
FIG. 3 is a pictorial representation of the circuit node of FIG. 1 illustrating separate node identifications.
Figure 4:
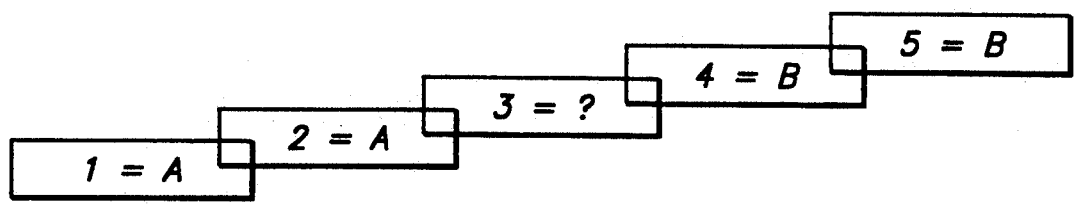
FIG. 4 is a pictorial representation of the circuit node of FIG. 1 illustrating the error connection.
Figure 5E:
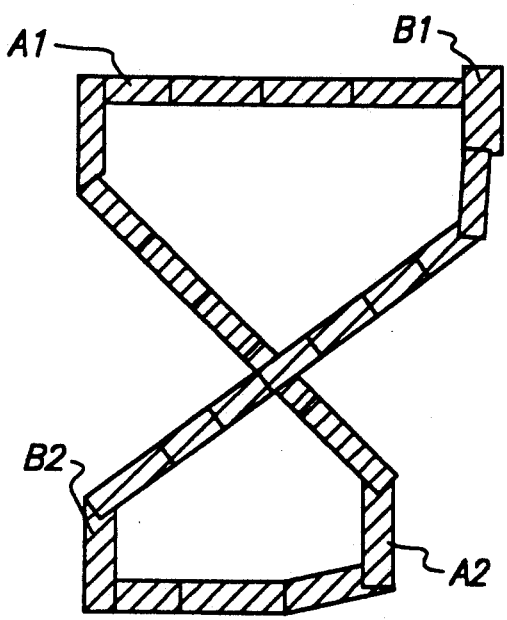
FIG. 5(a) is a pictorial representation of an exemplary complex circuit node comprising conductive polygons in an array of connections including at least one error connection.
FIGS. 5 B-D are pictorial representations of the circuit node of FIG. 5A analyzed in various ways to identify error connections.
Figure 5F:
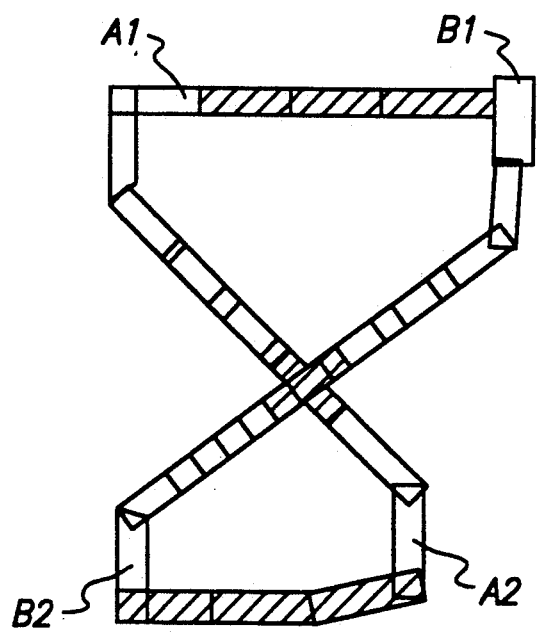
Figure 5G:
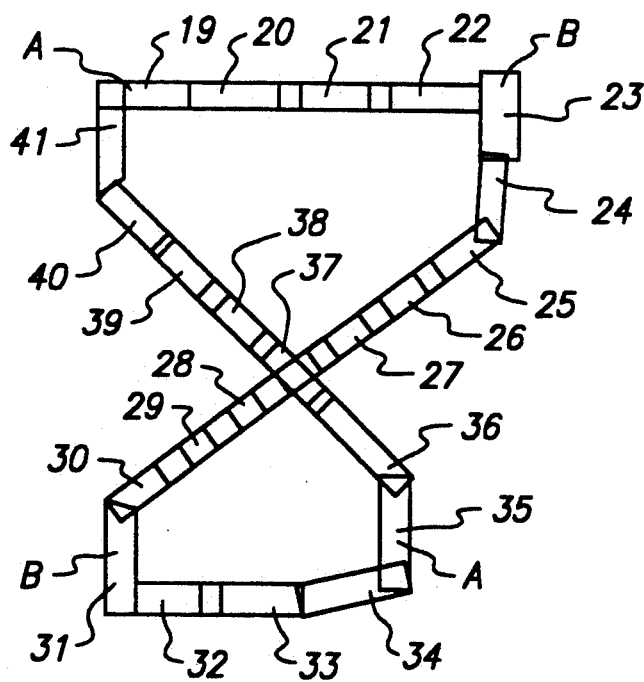
Figure 7:
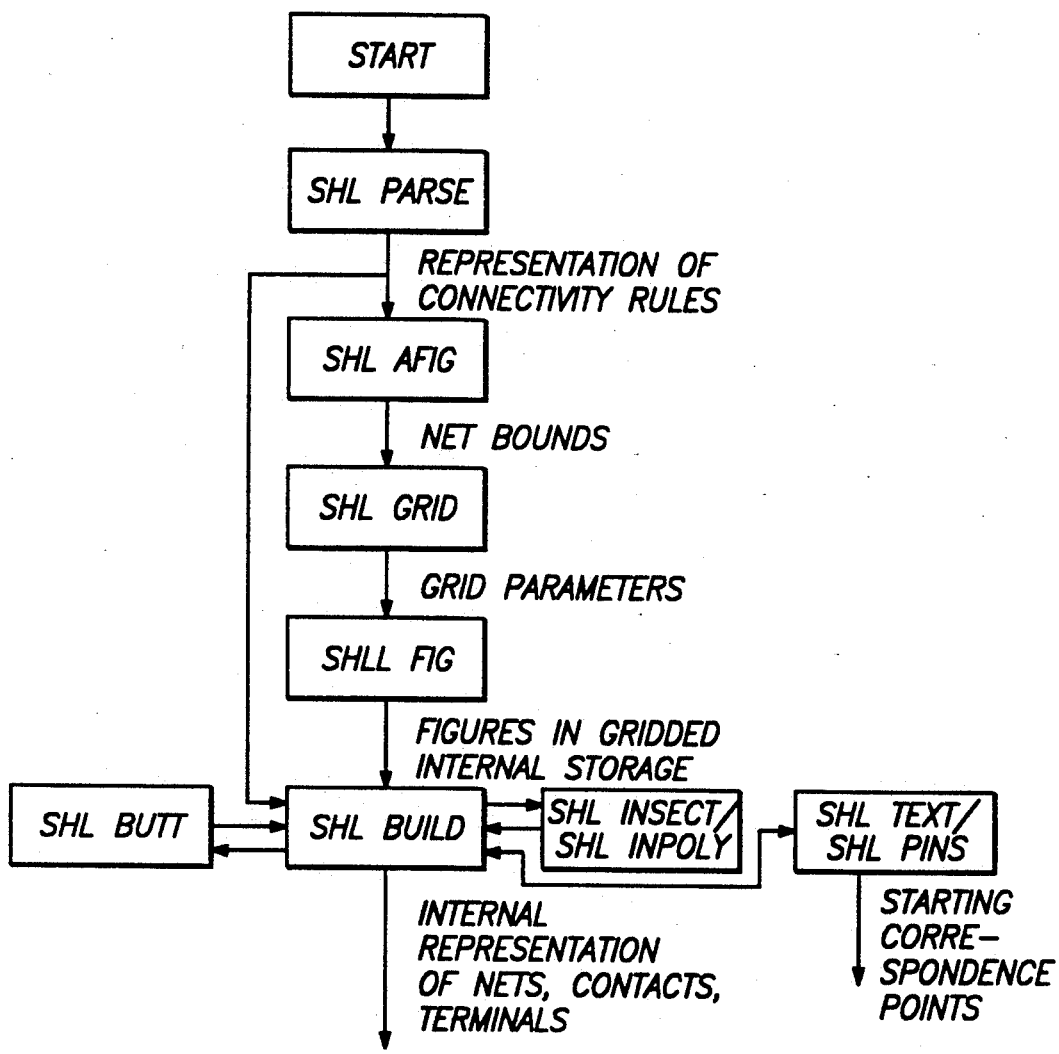
FIG. 7 is a flow chart illustrating the processing once per problem node according to the method of the present invention.
Figure 8:
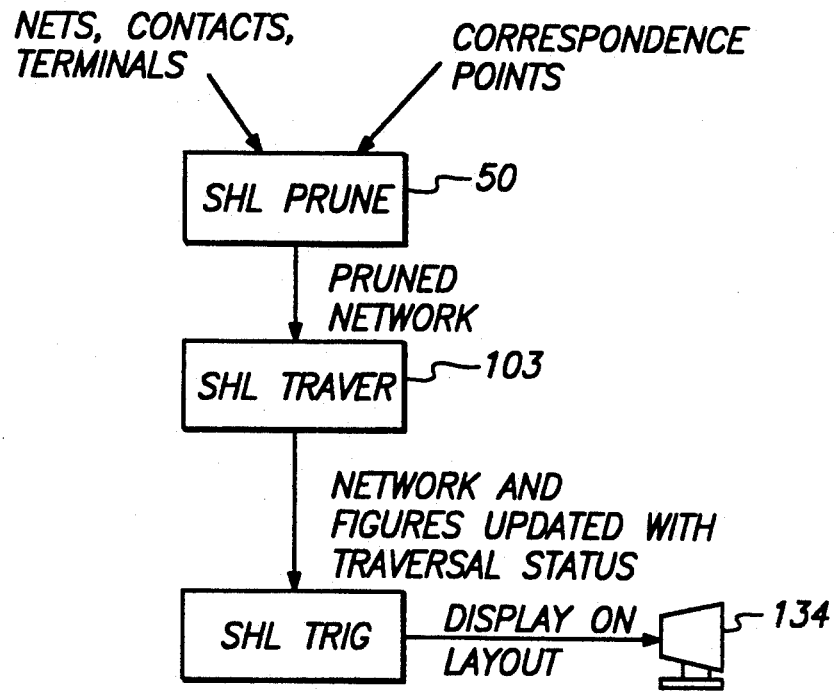
FIG. 8 is a flow chart illustrating the analysis of data derived during operation on a multi-polygon problem node according to the method of FIG. 7.
Figure 11:
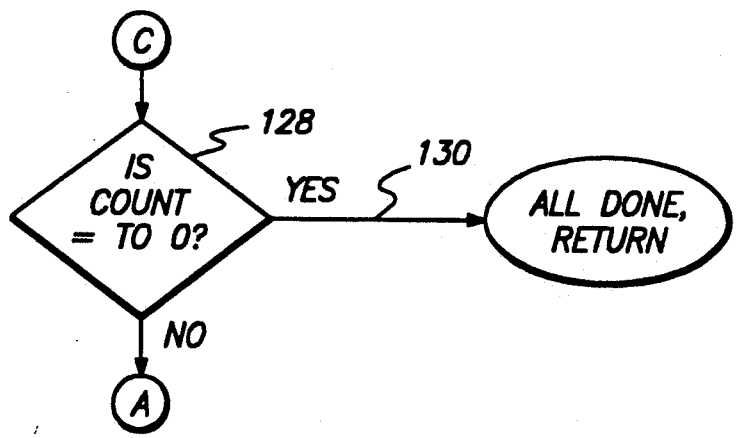
FIGS. 9-11 comprise a flow chart illustrating the prune process on polygons in a problem node according to the present invention.

Referring now to FIG. 5G, there is shown a pictorial representation of an electrical node in an integrated circuit layout on which a user designates correspondence or reference points A, B, etc. which are known to be associated with one or other of a plurality of electrical nodes that are short circuited together at one or more locations on such nodes. In accordance with one embodiment of the present invention, as illustrated in the flow chart of FIG. 6, the method proceeds to initialize 11 the data structure and memory locations in the host computer system, as previously described. This includes retrieving the connectivity information that was stored when the circuit nodes were originally extracted from the circuit layout, and creating therefrom an internal data structure that indicates what layers are interconnected and what layers are contacts and named nodes including flags to indicate the interconnected layers that are connected by a contact. The process then proceeds once per problem node to prepare for traversal of the problem node in order to identify the polygons that form the node in the circuit layout, as later described herein. The Step 13 of preparing the problem node may involve one or more processing routines, as illustrated in FIG. 7 and described in the Appendix attached hereto. Then, the data accumulated in the Problem node preparation is analyzed 15 once per analysis pass, as illustrated in FIG. 8 and as later described in detail herein, to locate probable short circuit connections in the node. The Step 15 of analyzing the Short may involve one or more routines, as illustrated and described in the Appendix attached hereto. Thereafter, the method proceeds to break down remaining, single nodes via high resolution processing 17, as later described herein, which segregates the single node into a plurality of contiguous polygons that can then be processed individually in a manner similar to the processing that previously reduced node ambiguities in the rest of the circuit layout.

Referring therefore to FIGS. 5G and 7, the process of the present invention proceeds to identify each of the interconnected polygons 19-41 that form a single electrical node. A suitable representation of the electrical node may be displayed to a user in order to facilitate the user introducing correspondence or reference points A, B, etc. that are known to be associated with one or other different electrical nodes that are determined to be shorted together at one or more unknown locations. In accordance with the present invention, the process starts at a selected correspondence or reference point, say polygon 19 designated by the user as associated with node 'A.' The process then tests the connectivity of each polygon in a forward direction along the sequence or succession of connected polygons along a path of the node toward another designated correspondence point. "Forward" direction detection refers to initially 'visiting' each new polygon not previously visited and accumulating data thereon for formation of and storage within an assembled data structure. Thus, a 'visit' to polygon 41 would provide data that it is initially visited and that it is connected to polygon 19. Potentially, this polygon 41 may be marked 'success' for its proper connection to polygon 19, but is not so marked yet until all the polygons along a path of polygons arrives at another correspondence or reference point of the same node name. Therefore, each of the polygons 40-36 is initially visited and marked in the accumulating data structure to indicate visited and properly connected to a previous polygon. Then, upon visiting polygon 35, the process of the present invention identifies this polygon as a designated reference point on node "A" that is properly connected to the prior polygon 36 which was previously determined to be properly connected to node "A". Therefore, all of the polygons 41-35 were determined to be properly connected to node "A", and each such polygon can now be marked "success".

The process will now "back up" until it can find an unexplored branch. When polygon 37 is encountered, two unexplored paths remain: that path starting at polygon 27, and that path starting at polygon 28. Selecting polygon 28, the process discovers that this has already been marked as a correspondence point for "B". Since this is not the same as the correspondence point the process started from ("A"), the branch is considered to have "failed". Thus, the process now traverses backward, looking for further unexplored branches, but marks polygons 30-28 as "failures" as it goes. Next the process continues with polygon 27-24, and then encounters polygon 23, also a "B" correspondence point. During the backtracking operation, polygons 24-27 are also thus marked with "failure". Backtracking now continues all the way back to the initial starting point (polygon 19). Here there is another, unexplored branch, so traversal goes down the path of polygons 20-22. When polygon 23 is encountered, it is again a "B" correspondence point, so during the backtracking process, polygons 22-20 are marked as "failure". The backtracking terminates when it returns to polygon 19, as there are no unexplored paths.

Next, the process goes to the next correspondence point for "A" (polygon 34) and starts again. In this case, polygon 36 has already been processed, so the traversal proceeds with polygon 34-32. When it encounters node "B" in polygon 31, is backtracks and marks 32-34 as "failure".

Once the pass starting from all "A" correspondence points is complete, the status codes (SUCCESS or FAILURE) are copied into the cumulative status fields for all nets and contacts.

Next the process performed for the "A" correspondence points is repeated for the "B" correspondence points. First, all of the status fields in the nets and contacts are cleared. The traversal process begins from each "B" correspondence point. Assuming that the process begins at polygon 23, it will explore the path including polygons 24-27. At polygon 27, there are multiple alternative unexplored paths. The process will continue along the path of polygons 37-41, and then encounter an "A" correspondence point at polygon 19. Since this is a different name than the starting name, the process backtracks to polygon 37 while marking polygons 41-37 as "failure". At polygon 37, it finds several unexplored paths, and proceeds down the path including polygon 36. The process then encounters "A" at polygon 35. Since this is not the starting name, polygon 36 is marked as "failure" while backtracking. At polygon 37, the branch of polygons 28-31 is explored. Since this ends with a "B" correspondence point, the current traversal path is marked "success" (polygons 30-24). There are no further unexplored paths, so traversal ends from this starting point.

The process next proceeds to the next "B" correspondence point. In this case, it begins from polygon 31. There is only the one unexplored path from polygon 31, that includes polygons 32-35, so this is the path that is explored. Since the traversal ends on polygon 35 which is an "A" correspondence point, the backtracking process marks polygons 34-32 as "failure". When it returns to polygon 31, there are no more alternatives, so the process terminates.

Since the "B" pass is now complete, the results from this traversal are now merged into the cumulative status fields. More specifically, the marking of polygons newly visited and previously visited in the problem node are combined according to the following set of rules:

a) if an entry was already "success", change it to "failure" if the new entry is "success";

b) if an entry was already "success", do not change it if the new entry is "failure";

c) if an entry was already "failure", do not change it if the new entry is "failure";

d) if an entry is already "failure", change it to "success" if the new entry is "success".

Thus, for the example in FIG. 5G, the polygons along paths from each of the user-designated reference points on a node may be visited and tested in the manner as previously described to conclude with paths of polygons marked with "success" for reference point "A" (e.g., polygons 19 and 41-35), and for reference point "B" (e.g., polygons 23-31), and marked with "failure" at the junction (e.g., polygons 27, 28 37) and along the paths between reference points "A" and "B" (e.g., polygons 20-22 and 32-34). Then, only those polygons which are marked "failure" may be considered "ambiguous", and representations of those ambiguous polygons may be displayed to the user as an aid to the user providing additional reference point information by which to resolve such remaining ambiguities.

After the problem node is prepared for the traversal just described, but before the actual traversal, then as illustrated in FIG. 8, a pruning "sweep" is first performed to remove from subsequent analysis those polygons which "cannot" contribute to the short circuit problem.

Then multiple sweeps of the derived data are performed, one for each different electrical node name mentioned in the information supplied by a user. Thus, a "sweep" is a traversal of the nets and contacts of the problem node. The three modes of operation are: "search", "success", and "failure". In search mode, the traversal moves forward searching either for "success" or "failure", where "success" means that another net marked with the same mark as the original starting point has been found, and "failure" means that another net marked with a different mark from the original starting point has been found.

As the network is traversed forward from the original starting point, each net is marked with a code representing "search" mode. As it is traversed, each terminal is marked with a "taken" code to guide the traversal process so that it does not double back on itself. When "success" is found, the entire path from the current point back to the last correspondence point is re-marked from "search" to "success" (one mark per net polygon). The mode then reverts to "search" and the traversal continues from its point of greatest forward progress. If "failure" is found, the process backs up along its most recent traversal path, marking each net on the path as "failure". This "backing up" terminates as soon as an alternative forward path is found. The mode then reverts to "search" and the traversal continues. Eventually, all net beads are marked either "success" or "failure", or because of feedback loops in the circuit they remain in a "search" mode. If any "search" mode entries remain, further passes are made 'push' the status of known nodes into the unmarked areas. When the pass for the first node name is complete, all the node markings are transferred into the cumulative status originally set up in the data structure. Each entry is now a "success" or a "failure". The traversal process may then be reinitialized and the next node name may be selected to be analyzed. A starting point is selected and the entire traversal procedure, as previously described, is performed again. When done, all "success" and "failure" results are transferred to the cumulative status, this time following the following set of rules:

a. If entry was already success, change it to "ambiguous" if the new entry is "success".

b. If entry was already success, do not change it if the new entry is failure.

c. If entry was already failure, do not change it if the new entry is failure.

d. If entry was failure, change it to "success" if the new entry is success.

After all the different node names are processed through the traversal and the transfer routines as previously described, then the cumulative status is checked for failures, and all "failures" are changed to "ambiguous". Thus, in accordance with the method of the present invention, an unambiguous path is one which has exactly one case of success and the rest failure. If all paths through a net are "failure", or if two or more paths are "successes", an ambiguity exists that must be resolved. The user may supply additional information about reference points, and the processes previously described may be repeated.

Reduction of the problem node to a number of large polygons does not preclude further analysis. Rather, they can be further analyzed in the high resolution mode of operation 17, as later described herein in detail. This high resolution processing breaks up the remaining problem node that still includes ambiguity with two or more different electrical nodes into a plurality of abutting subpolygons that can thus be processed in the 'search', 'success', and 'failure' modes of operation as previously described in order to further resolve ambiguities. After all ambiguities involving shorted connections are resolved for a given circuit the layout, the processing terminates.

DETAILED OPERATION

Referring now to FIGS. 8–11, there is illustrated a detailed flow chart of the 'pruning' processing during a pass over the polygons that are included in the problem node. The initial steps 84 initialize counters and clear flags in preparation for analysis 86 of data for the first net. If this first net is not already pruned 88, then the process determines 90 whether it is a correspondence or reference point and, if it is, proceeds to the next 92. If it is not a reference point 94, then the number of unpruned contacts connected to it are counted 96 and if more than one net is connected to it 98, then the process proceeds to the next net 92. If not more than one net is connected, then the net is marked as pruned 100 and the count is incremented by 1 as the process proceeds to the next net 92.

Figure 9:
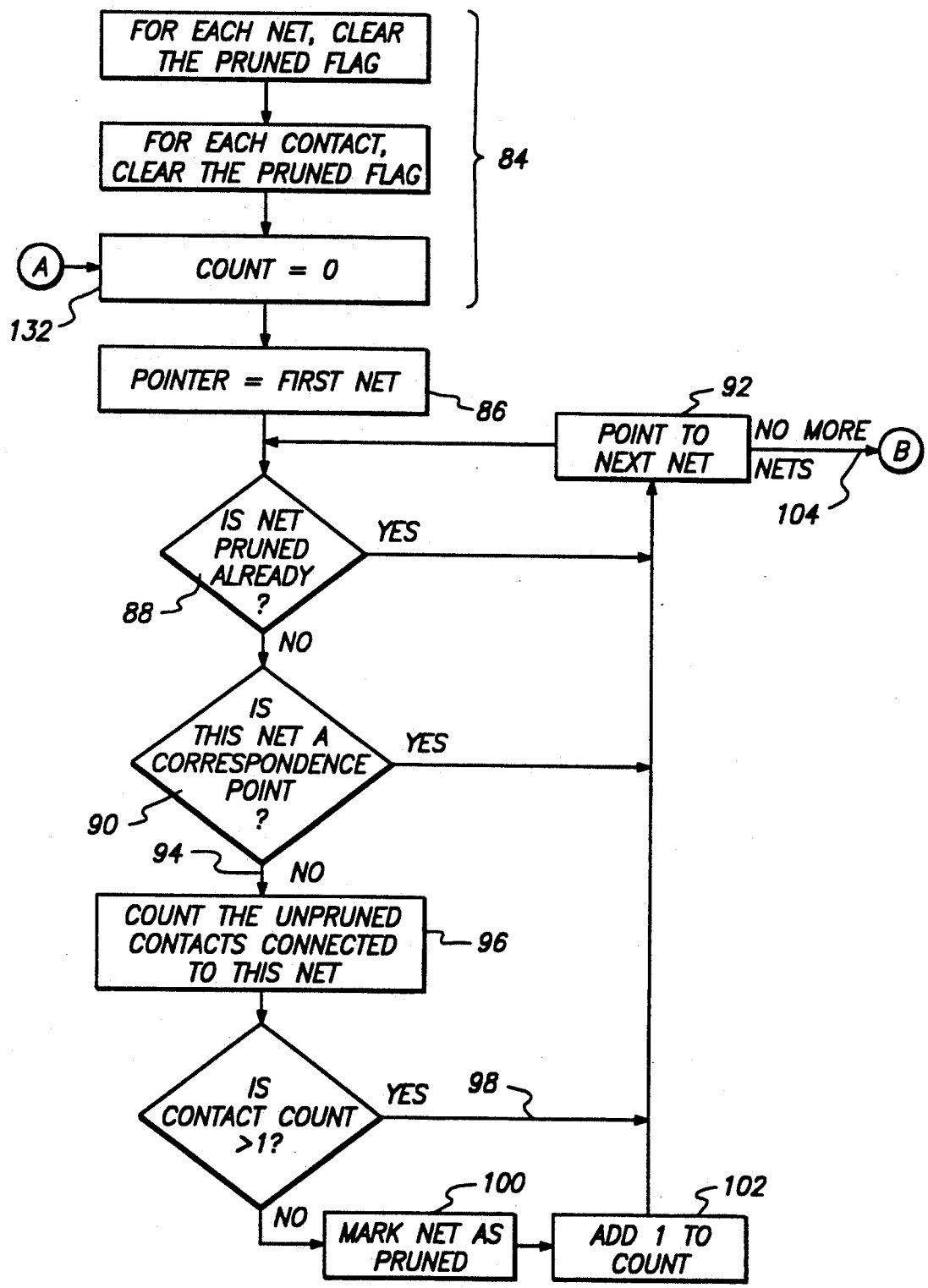
Figure 10:
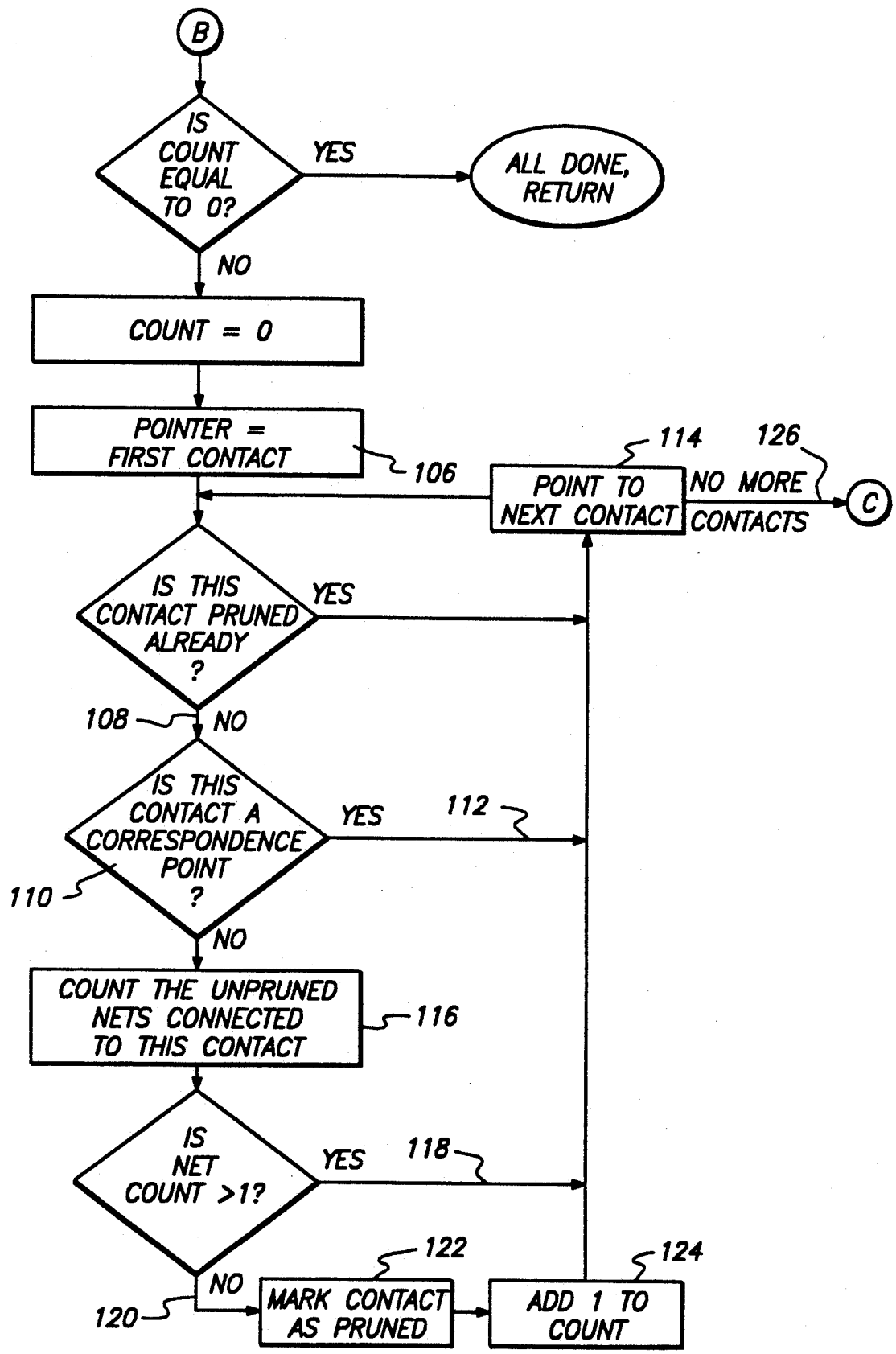

When there are no more new nets 104 then, as illustrated in FIG. 9, the process proceeds to analyze contacts commencing with the first contact 106. If this contact was not previously pruned 108, then the process determines whether this contact is a correspondence point 110 (identified by the user), and if so 112, proceeds to the next contact 119. If the contact was not a correspondence point, then the unpruned nets connected to this contact are counter 116, and if the count is more than one 118, the process proceeds to the next contact 114. If there is not more than one net connected to the contact 120, then that contact is marked as pruned 122 and the count is incremented by 1 as the process proceeds to the next contact 114.

When there are no more contacts 126, the process determines 128 whether any contacts or nets were pruned. If some were pruned, another pass may be necessary as new contacts and nets may now be eligible for pruning. The process concludes 130 if there are none, or returns 132 to the first net 86 for the next pruning analysis. Thus, this process iterates until no more nets or contacts are pruned.

Figure 12:
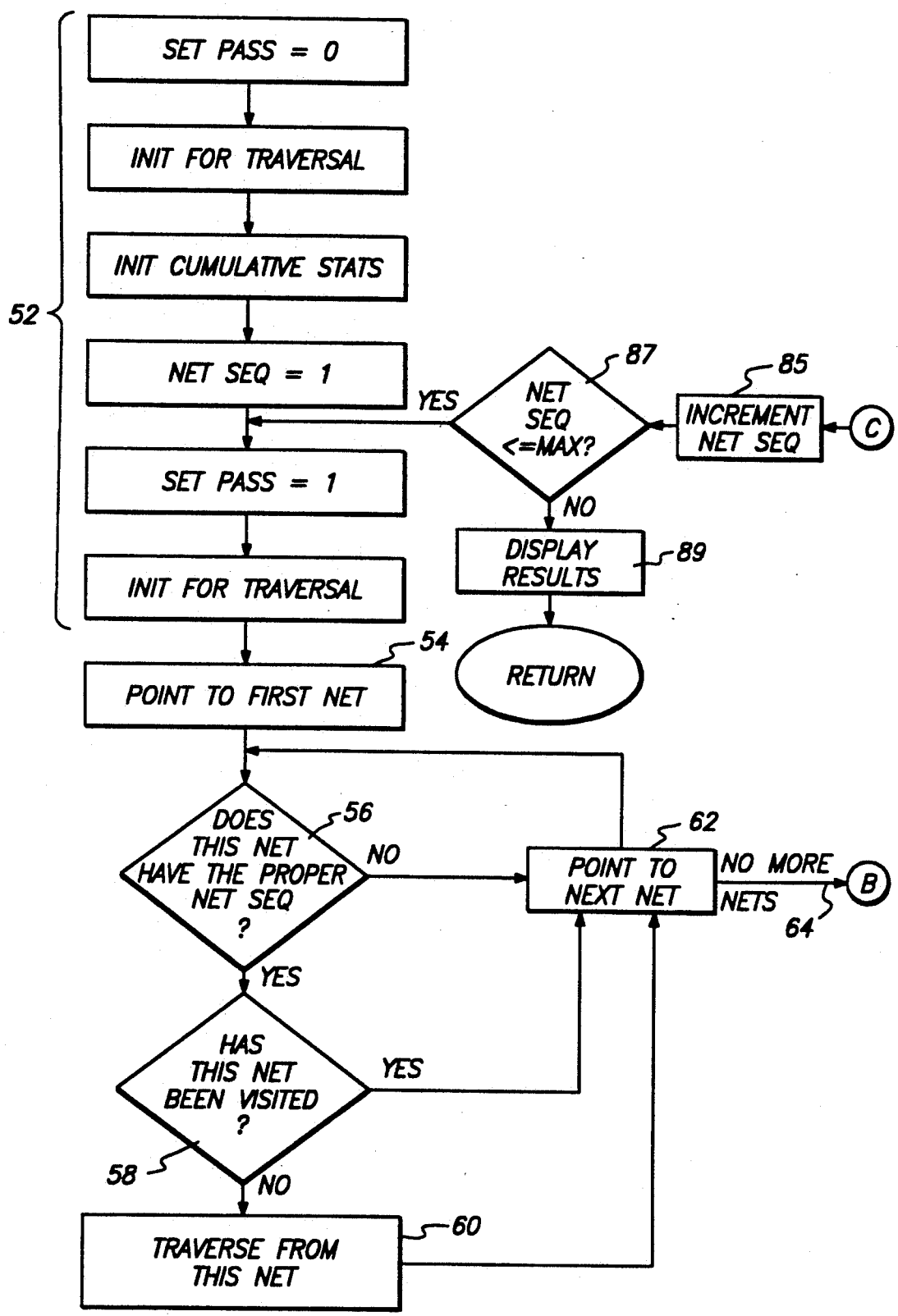
FIGS. 12-13 comprise a flow chart illustrating the traversal process on problem node polygons remaining after the process of FIGS. 9-11.
Figure 13:
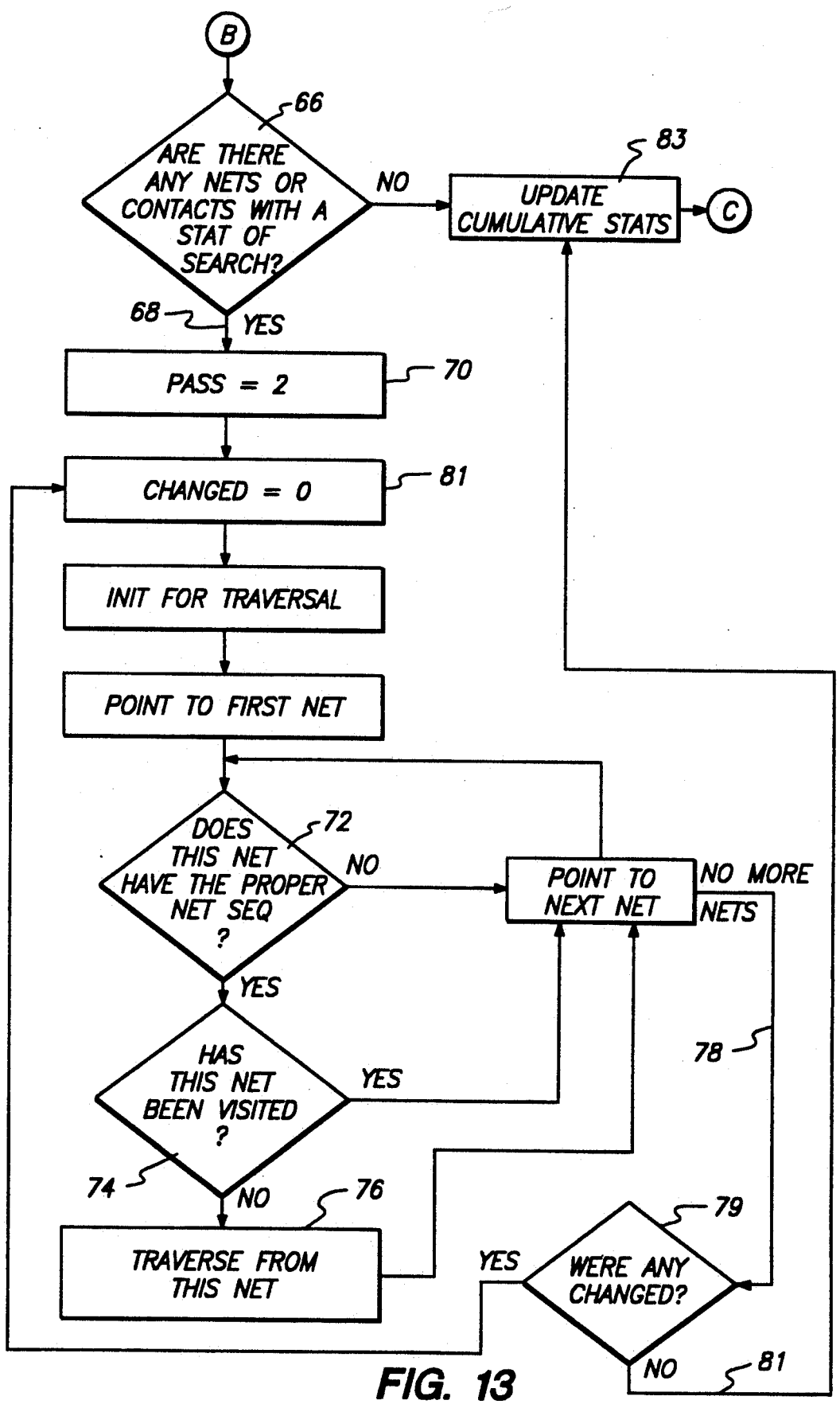

As indicated in FIG. 8, the pruned network is then processed via traversal procedures 103, as indicated in FIGS. 12 and 13. Initialization steps 52 set up initial conditions in a data structure within the computer's memory by means of conventional computer techniques, setting pass counters to zero and initial net to 1, and the like, in preparation for traversal. For each net sequence value (such as 'A', 'B'), a loop is made examining each net to determine if it is a suitable starting point. The first net in the chain 54 is examined. If this net is a correspondence point for the desired net sequence 56, then it may be tested 58 for whether it was investigated or visited previously. If not, then traversal proceeds from this net 60 to the next net 62 until all nets are reviewed. When no more nets remain 64, then the process tests 66 for contacts or nets with the status of SEARCH mode. If any are found 68, then in a second pass 70, such net is tested 72 for proper sequence, as previously discussed, and for whether it was previously visited 74. If not, then traversal proceeds 76 to the next until there are no more nets 78. If any of the net data was changed 79, then the process repeats, starting at the first unvisited net until no changes are required 81. Then, the process updates 83 the cumulative status for the passes (according to the rules previously described), and then increments 85 the net sequence number until the maximum net sequences is surpassed 87. The ambiguous nets represented by the accumulated data in the data structure are then displayed 89 to the user. As illustrated in FIG. 8, the traversal status (ambiguous vs. non-ambiguous) of the pruned problem node is available for display to the user.

Figure 14:
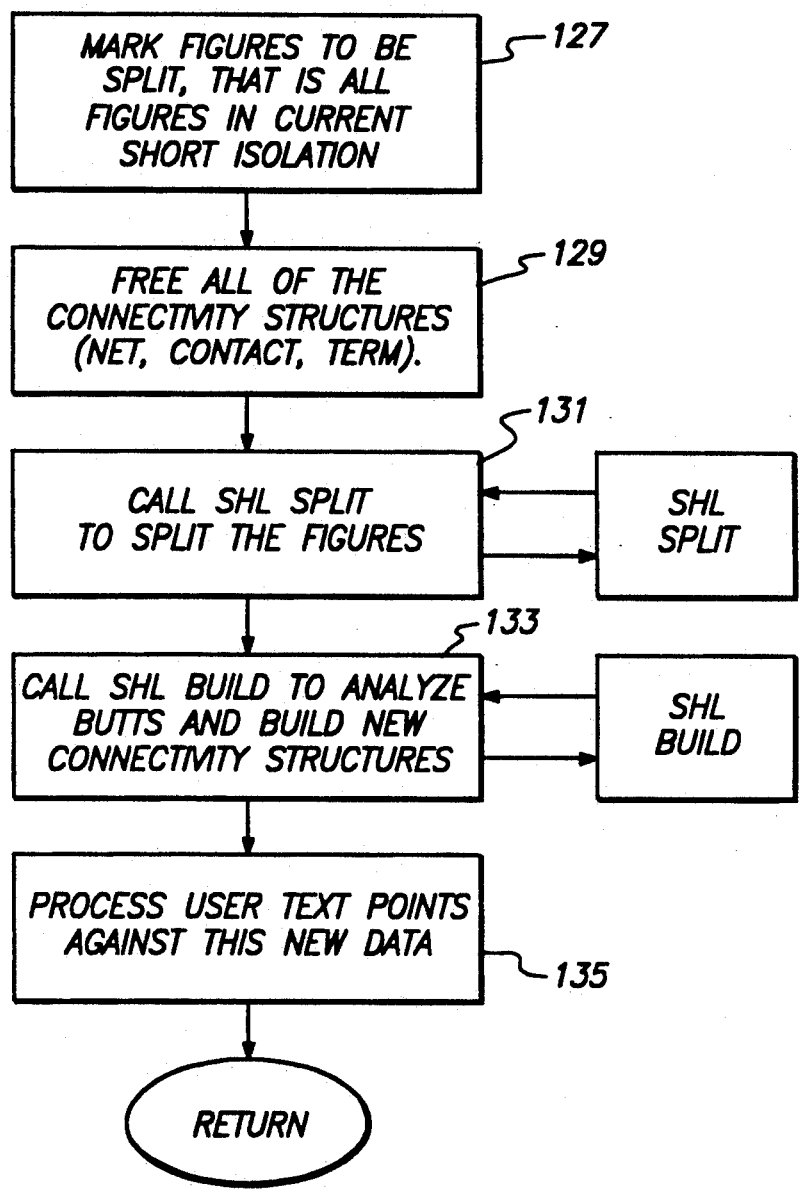
FIG. 14 is a flow chart illustrating the high resolution mode of operation of the present invention.

In the event one or more passes through the accumulated data for polygons, or nets and contacts, reduces ambiguity to one or more large polygons 123 which are associated with different named electrical nodes, then the high resolution mode of operation 17 may be invoked by which the large polygons are broken down into a plurality of smaller connected polygons that can then be analyzed in the manner previously described. In this operating mode, as illustrated in FIG. 14, the electrical node to be analyzed in high resolution is marked 127 and isolated 129 from other nets and contacts for splitting up 131, as later described herein. Then each new polygon in the split up problem node is characterized as connected in abutting relationship to adjacent other polygons 133 for processing 135 of this 'new' network against reference points that are supplied by the user.

Specifically as illustrated in FIG. 15, there is shown a large circuit node on which reference points associated with different electrical nodes happen to exist, and which is to be broken up for further analysis. Briefly, inside corners 145-149 along the periphery of the node are identified, and vectors are drawn from the corners to an opposite peripheral boundary using an alternating sequence of horizontal and vertical vectors, for example, as the identified corners are encountered in a clockwise succession. Of course, in another sequence, the node may be broken up into a different array of polygons. The electrical node thus characterized by the exemplary sequence therefore newly includes 6 polygons in abutting connectivity, with the reference point 'A' illustrated in the lower left of one polygon and with another reference point 'B' illustrated in the upper right of another polygon. The path between different named reference points on the node may now be analyzed in the manner previously described to resolve the ambiguities for display to and interaction with, a user who may provide additional reference point information to aid in resolving the remaining ambiguities.

Figure 15A:
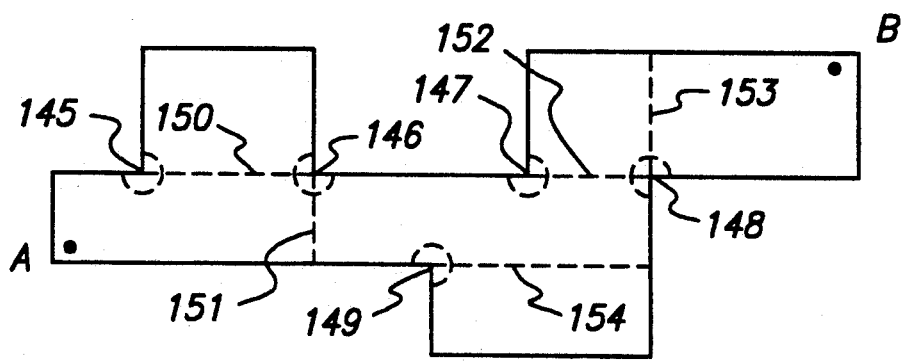
FIGS. 15(A) and 15(B) are pictorial representations of a single polygon circuit node being split according to the high resolution mode of the present invention.
Figure 15B:
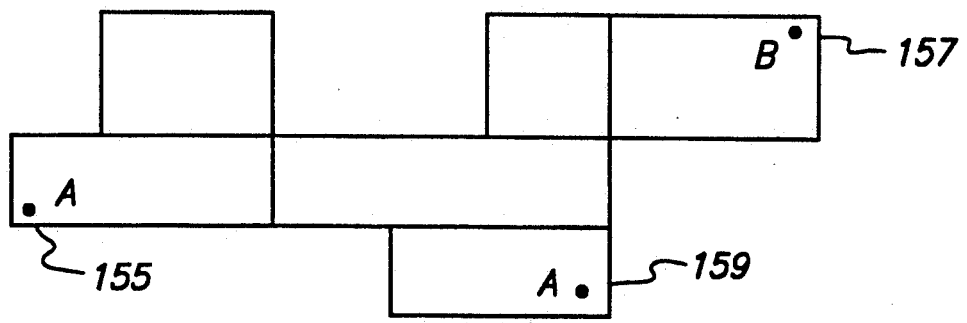

As illustrated in FIGS. 15A and 15B, a break along one vector 151 establishes adjacent polygons that are characterized as still connected together for analysis as if they had been entered separately by the user.

Figure 16:
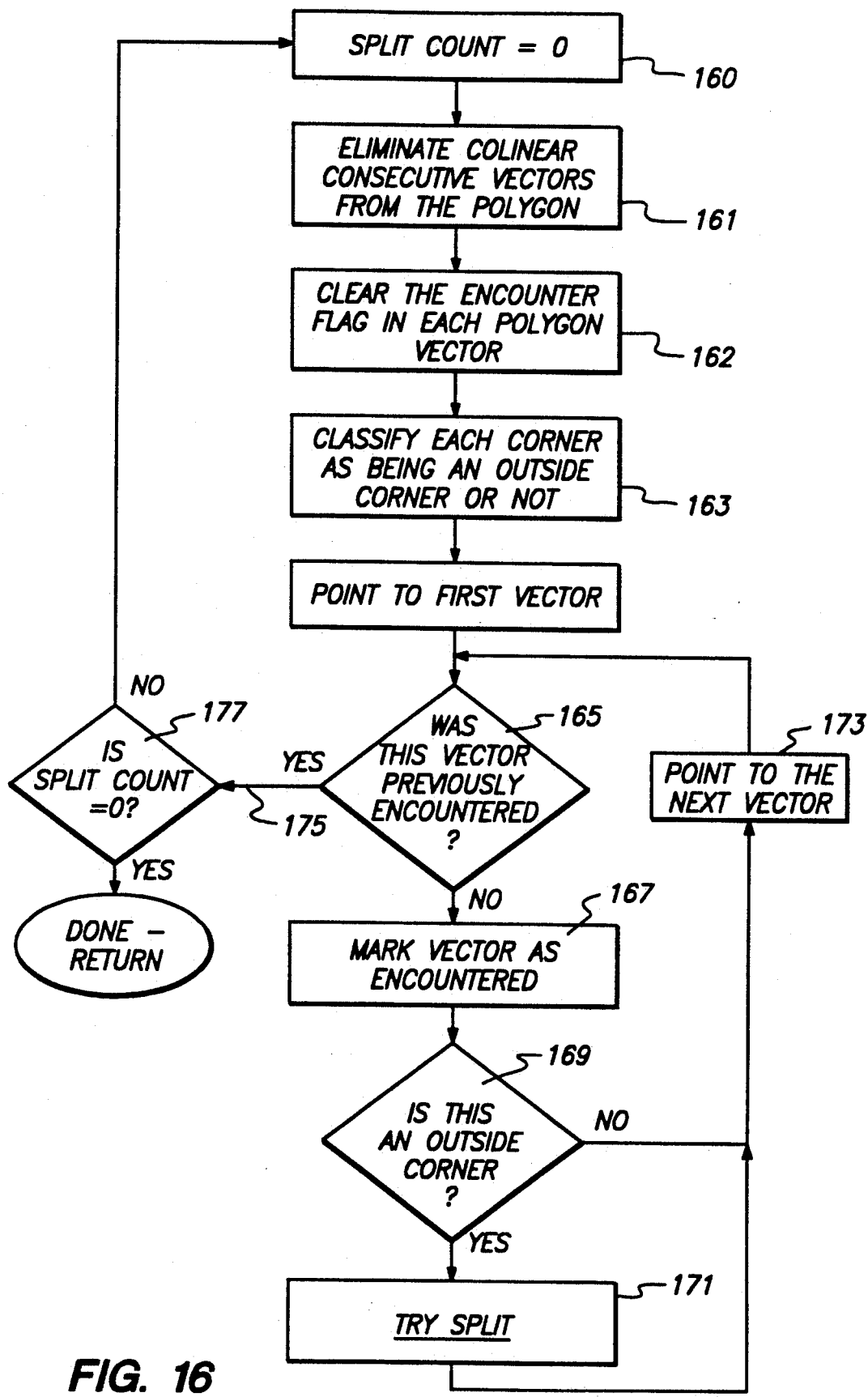
FIG. 16 is a flow chart describing the processing of a circuit node as illustrated in FIGS. 15(A) and 15(B)

Referring now to FIG. 16, there is shown a flow chart illustrating the process by which a large, single polygon is broken up into a plurality of polygons for further analysis. After initializing various parameters including the count 160 of splits and the elimination of 180-degree angles 161 in the polygons to be analyzed and the clearing 162 of encounter flags, the outside corners along the periphery of the node are identified 163 and the first vector is prepared for splitting the node. Each vector is tested for whether previously encountered 165 and, if not, is marked 167 as encountered. If it was determined to be an inside corner 169, a split at the corner is attempted 171 and the next vector is tested 173 until all possible vectors were previously encountered 175, and the count of splits is zero 177. This yields a linked list of polygons that are identified as connected to one or more adjacent polygons, as illustrated in FIG. 15(B).

Therefore, the process of the present invention operates on the connected polygons that were prepared in conventional manner to characterize a circuit node in order to reduce ambiguities regarding connectivity of polygons along paths of polygons between reference points associated with different electrical nodes. As ambiguities are resolved to a single electrical node, a high resolution procedure is invoked to break up the single node into a plurality of adjacent polygons which can be processed in similar manner to further resolve ambiguities regarding connectivities of polygons along paths of polygons between reference points associated with different electrical nodes. Of course, multiple passes between many more than two different reference points in a problem node are possible in accordance with the present invention in order to reduce ambiguities of overlapping or otherwise connected polygons that characterize the problem node under test.

Appendix

In one embodiment of the present invention, the Analyze Net step 13 of FIG. 6 may call forth for execution one or more of several routine processes that are designated as AFIG; GRID; LFIG and BUILD, which in turn may call forth for execution routine processes that are designated as TEXT/PINS; BUTT: INSECT; and INPOLY, all as later described herein. Also, the Analyze Short step 15 of FIG. 6 may call forth for execution an additional routine designated TRIG, as later described herein. Execution of the Initialize step 11, the Analyze Net step 13 and the Analyze Short step 15, and the High Resolution step 17 may be under control of a controlling routine designated FFUNCS.

Figure 17:
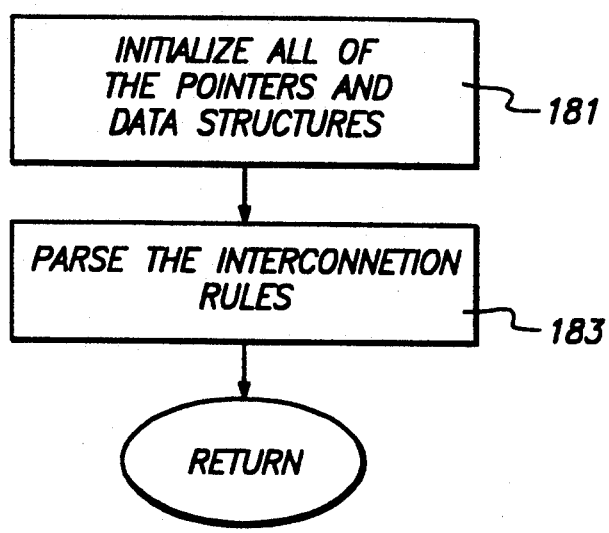
FIG. 17 is a flow chart illustrating the FFUNCS process exercising overall flow control in one embodiment of the present invention upon initiation of the search for short circuits.
Figure 18:
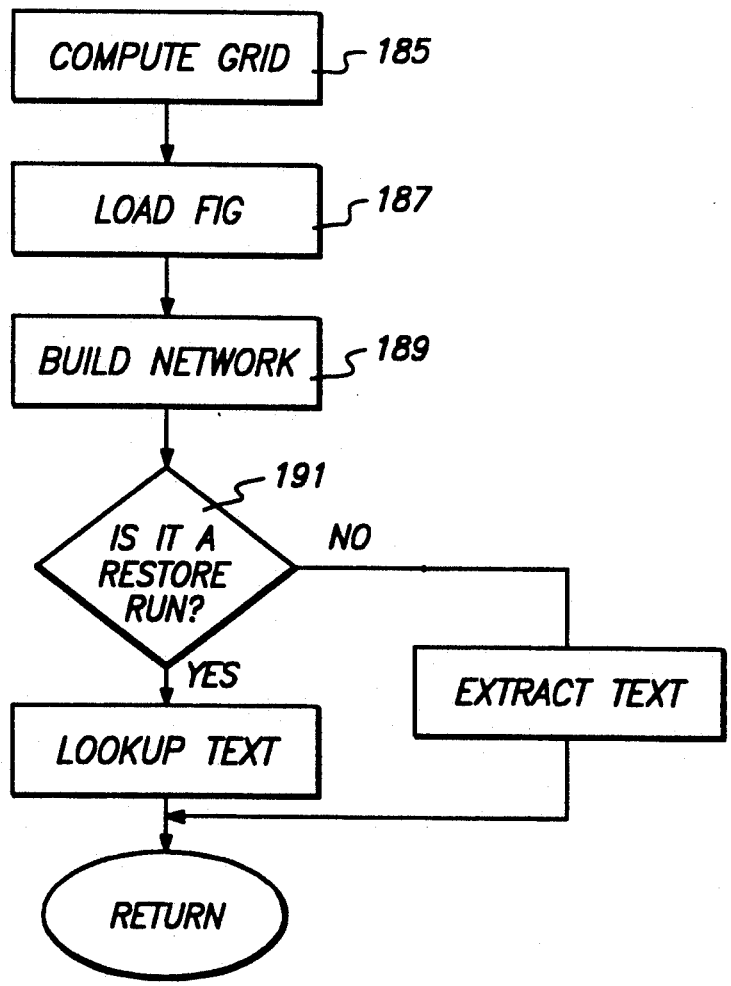
FIG. 18 is a flow chart illustrating the FFUNCS process upon analyzing the net according to the present invention.
Figure 19:
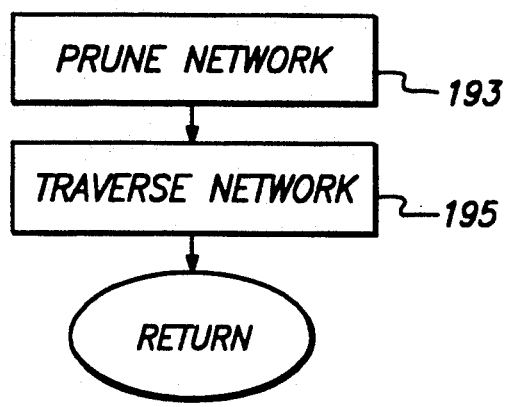
FIG. 19 is a flow chart illustrating the FFUNCS process upon analyzing the short according to the present invention.

At the start of processing, the FFUNCS routine is called to initialize all of the state variables, and to define all of the entry points for dialog with and inputs from the user, as illustrated in FIG. 17. The FFUNCS routine also controls execution of the Analyze Net step 13, as illustrated in FIG. 18, and controls execution of the Analyze Short step as illustrated in FIG. 19.

Figure 20:
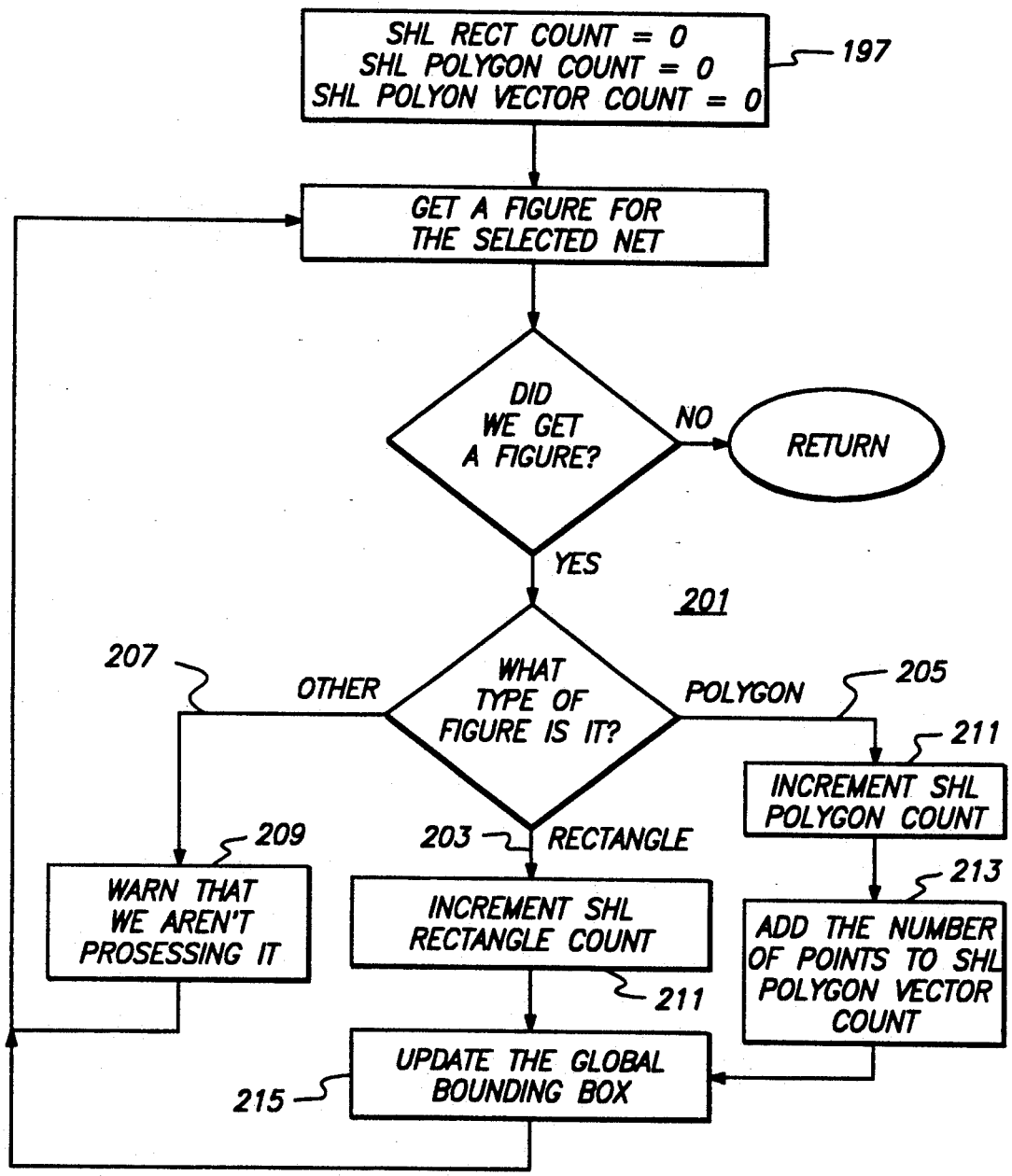
FIG. 20 is a flow chart illustrating the AFIG process during analysis of the net according to the present invention.
Figure 21:
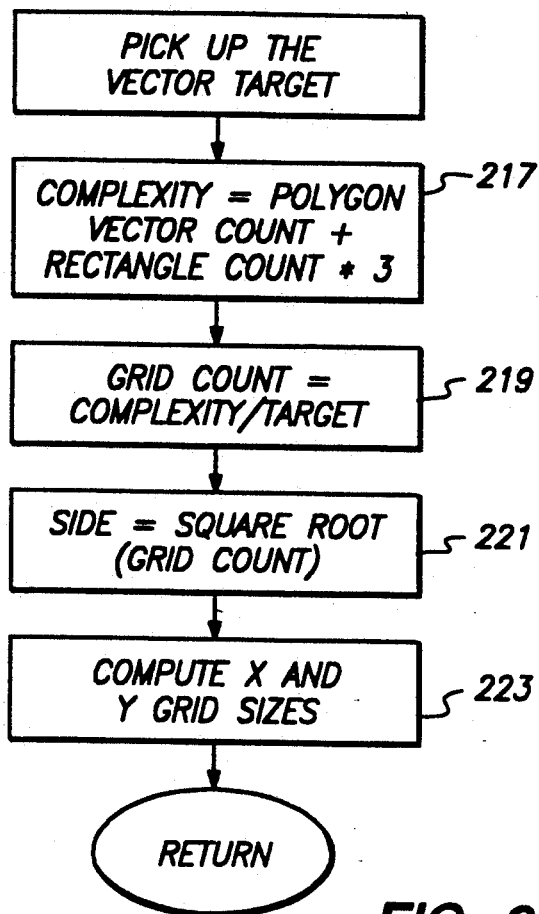
FIG. 21 is a flow chart illustrating the GRID process during analysis of the net according to the present invention.
Figure 28:
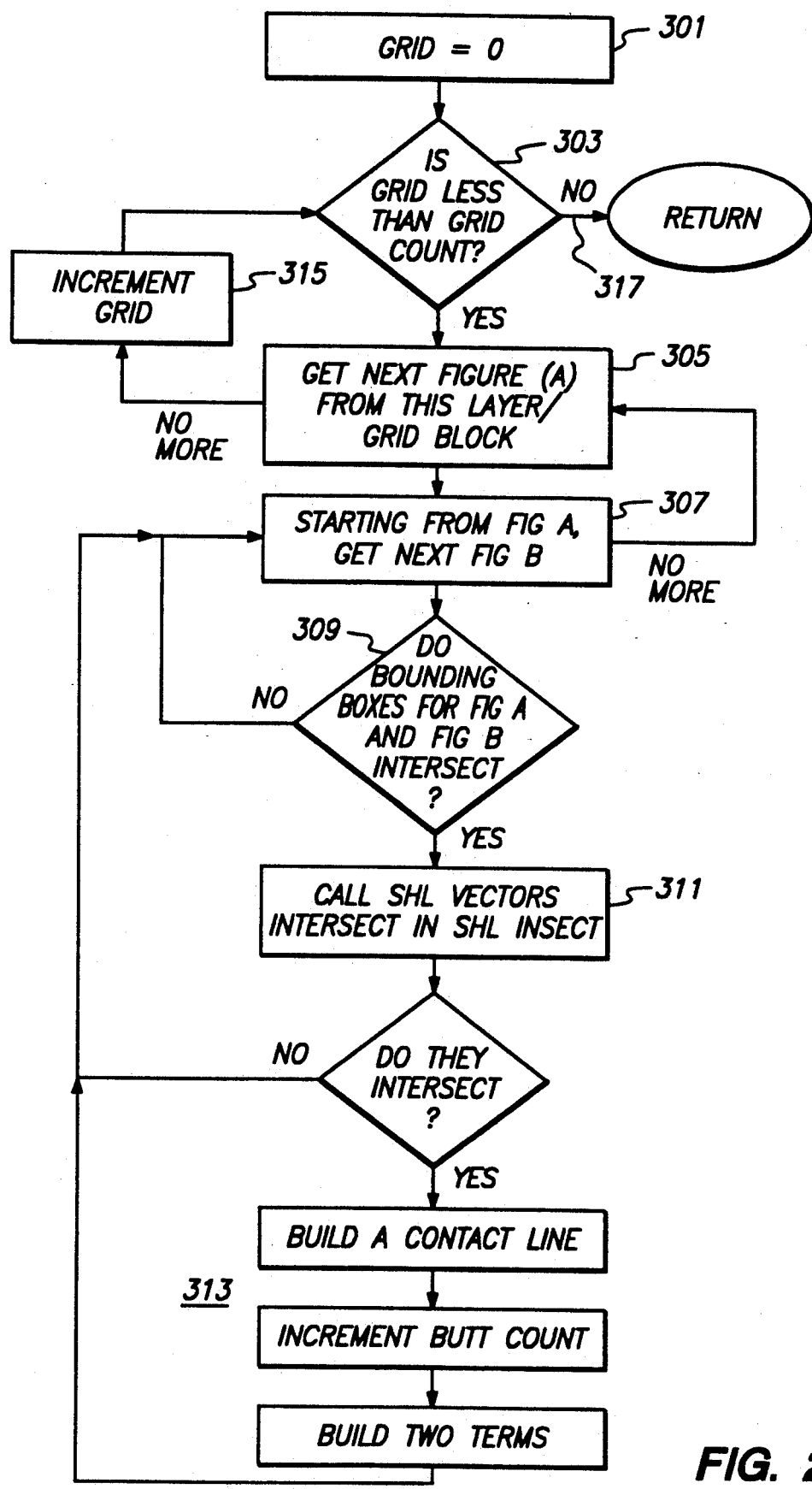
FIG. 28 is a flow chart illustrating the BUTT routine for properly connecting butting polygons on each interconnect layer according to the present invention.

The step 13 of Analyzing Net, calls forth for execution the AFIG routine, as illustrated in FIG. 20, and the GRID routine, as illustrated in FIG. 21, and the LFIG routine, as illustrated in FIGS. 22-25, and the BUILD routine may also call forth for execution the INSECT (intersection) routine and the INPOLY routine, the PINS routine and TEXT routine, and BUTT routine as illustrated in FIG. 28.

Figure 29:
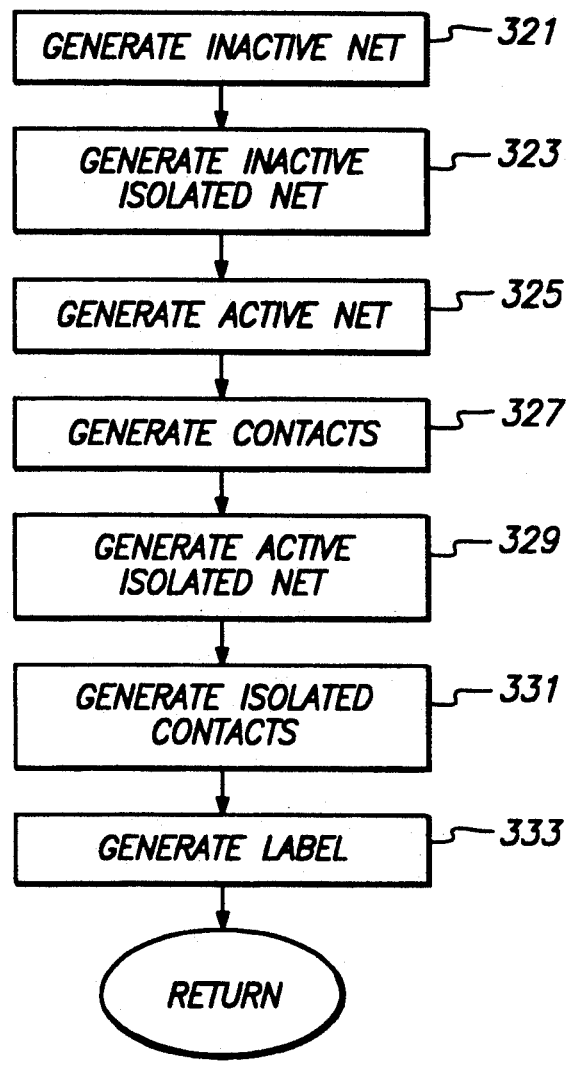
FIG. 29 is a flow chart illustrating the TRIG (Trigger) process for operation whenever a display of the short-location results with associated information is requested.

The step 15 of Analyzing Short calls forth for execution the PRUNE and TRAVERSE routines, as previously described, and the TRIG routine, as illustrated in FIG. 29.

Referring now to FIG. 17, there is shown a flow chart of the FFUNCS routine for initializing 181 all of the pointers and data structure and thereafter parsing (interpreting) the rules of the interconnection among layers and contacts. As illustrated in the flow chart of FIG. 18, the FFUNCS routine includes the steps of compute the grid 185 in which the size of the grid blocks is computed, as later described herein. Then, the process loads the FIG. 187 in preparation for connectivity analysis, as later described herein. The process then builds the internal representation of the connectivity of the problem node 189. The process next determines 191 whether this session continues from a previous session in which data was stored. If so, it looks up the text loaded from the saved text file. If not, it extracts correspondence points from the original graphical data. During the execution of FFUNCS to Analyze Shorts (step 15 of FIG. 6), the data accumulated during Analyze Net 13 is pruned 193 after which the traverse routine 195 is executed, as illustrated in FIG. 19.

Referring now to FIGS. 6 and 20, during execution of Analyze Net 13, the AFIG routine is executed to set to zero the rectangle, polygon and polygon vector counts 197. Thereafter, a figure is retrieved 201 from the data structure and identified as either a rectangle 203, or a polygon 205, or other 207 (for error indication 209). For retrieved rectangles and polygons, the appropriate counters are incremented, and the polygons are analyzed for the number of points to add to the polygon vector count 213. Also, the boundary data on the figures is updated 215 prior to retrieving the next figure in the problem node.

With reference now to FIG. 21, there is shown the flow chart of a GRID routine according to one embodiment of the present invention. This routine effectively overlays the problem node with an array of rectangular "grids" which bound the node's total area, and divide the vectors comprising the node into manageable numbers, only shapes falling into the same grid need to be processed together. In this routine, the complexity of a node is assessed by summing the polygon vector counts and rectangle counts times three 217, and the grid count is set equal to the complexity metric divided by the target number of vectors per grid 219. Then, the number of grids on a side of the overlay is set equal to the square root of the grid count 221 and the number of measurement units in the coordinate axes of a single grid is calculated 223.

Figure 22:
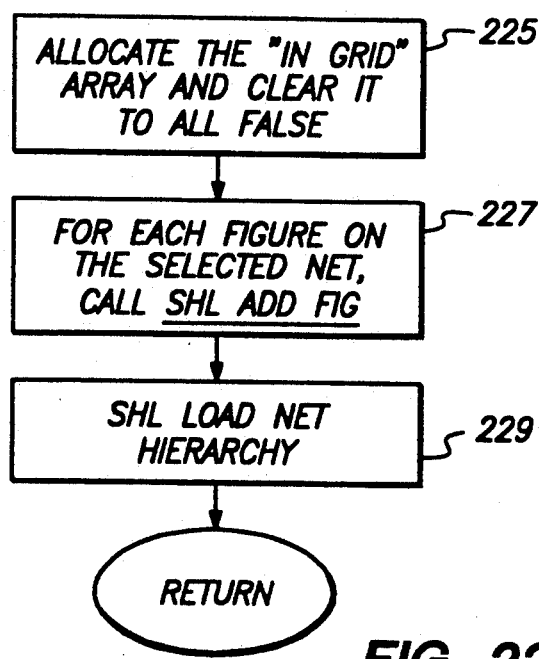
FIG. 22 is a flow chart illustrating the LFIG process during loading of a figure.
Figure 23:
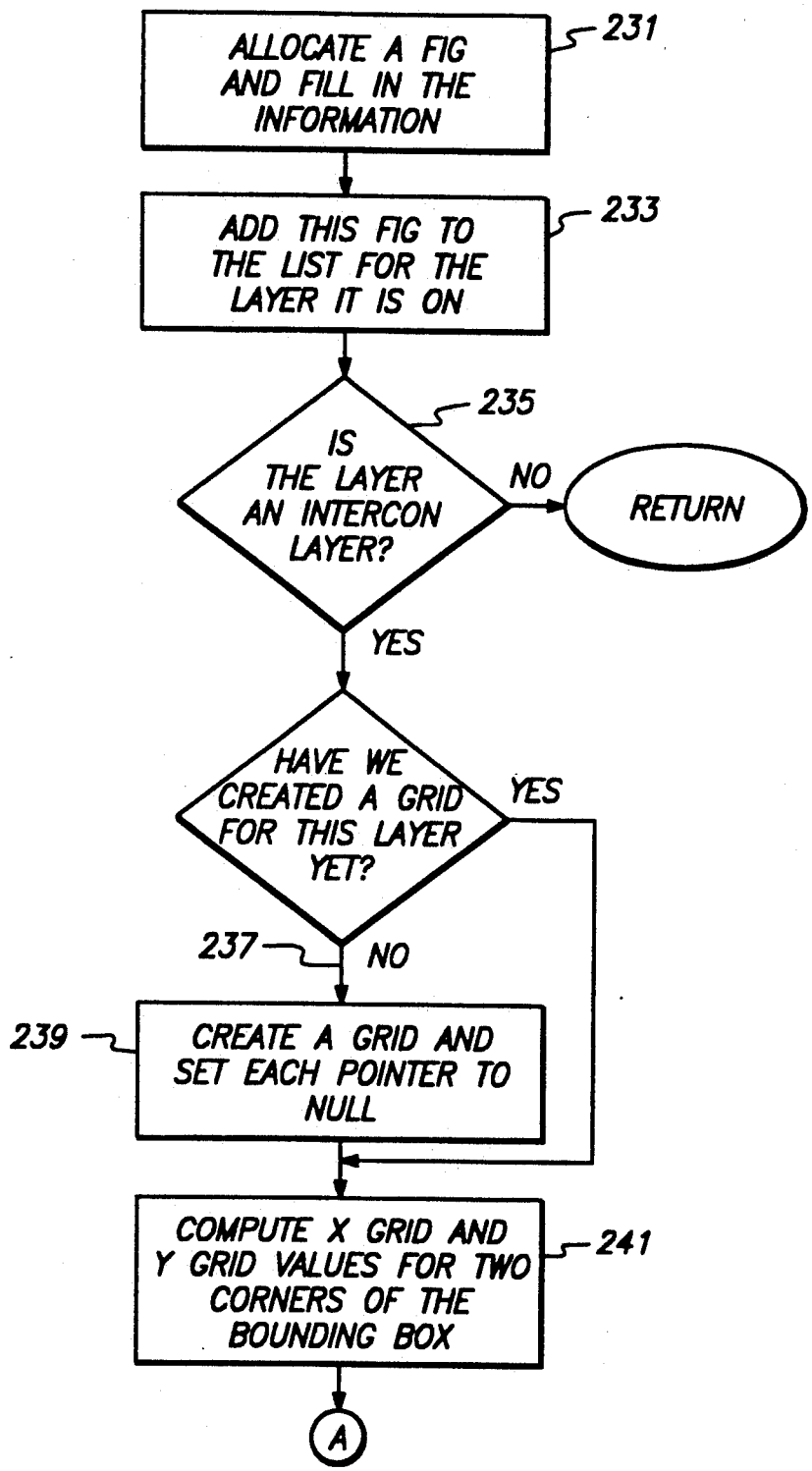
FIGS. 23-25 comprise a flow chart of the LFIG process during adding of a figure.

With reference to FIG. 22, there is shown a flow chart for the LFIG routine in which the initial step 225 allocates the "in grid" array and sets it to all false, after which, for each figure on the problem node, the routine illustrated and described hereinafter with respect to FIG. 23 is called 227 for execution, after which the net hierarchy routine 229 is called for execution.

Figure 24:
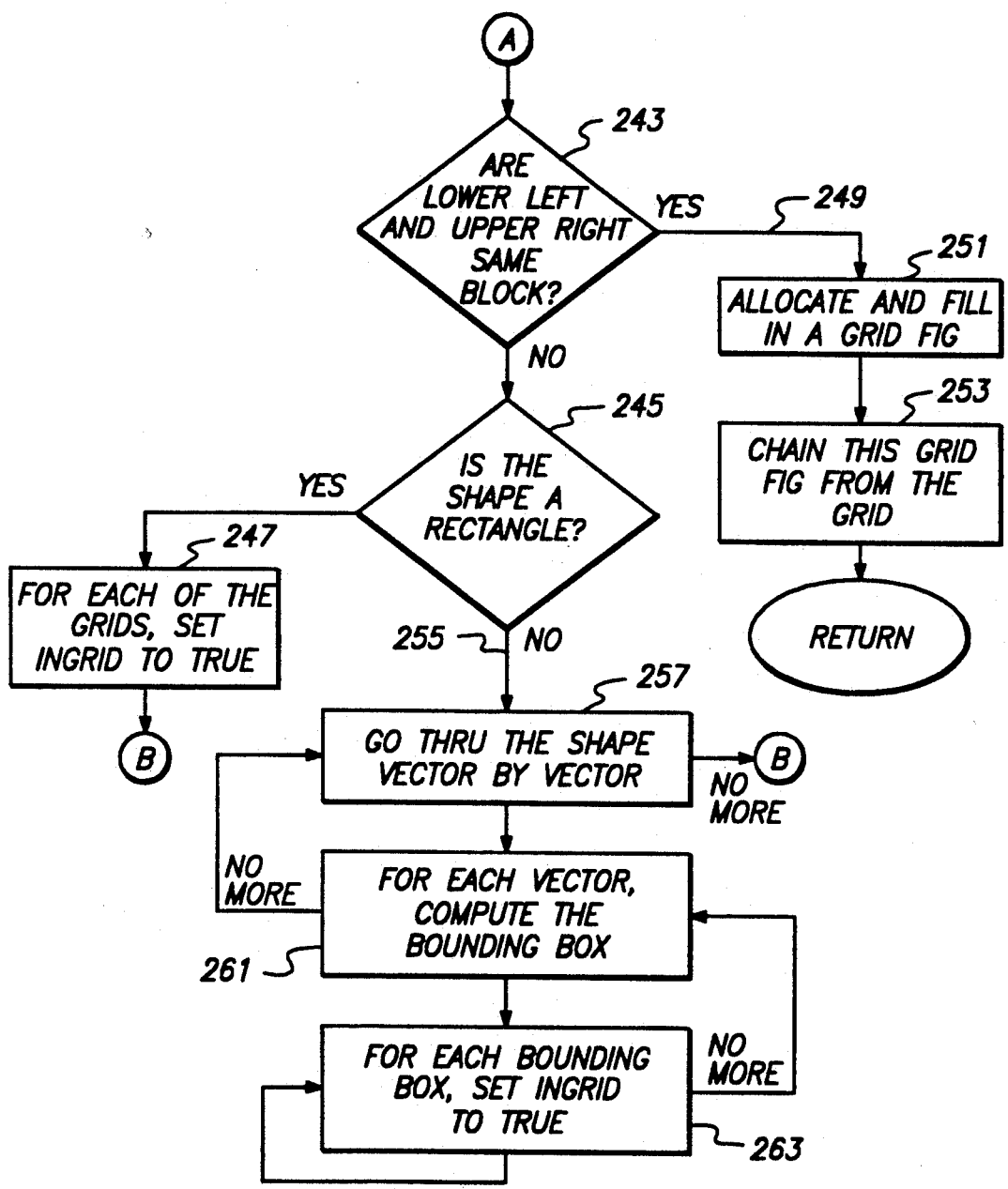

As indicated in the flow chart of FIG. 23, the process for each added figure includes allocating a data structure 231 for the added figure, together with the associated data therefor. Then, for the added figure, the process determines its associated layer 233 and whether the associated layer is an interconnect layer 235. Then, if this is the first figure for a given layer (a grid has not yet been created for the layer 237), a grid is created then the X and Y grid values are computed 241 for the figure's bounding box. As illustrated in FIG. 24, the lower left and upper right grid values are then tested for whether they are in the same grid block and, if not, the shape is tested for whether it is a rectangle 245. For a rectangle in all grid blocks, in the bounding box, the value of the variable 'ingrid' is set True 247. If the corners are both in the same grid block 249, then a memory location is reserved and a grid record is filled in 251 and is chained 253 with those of other figures found to be in the same grid. If the shape is not a rectangle 255, then the shape of the figure is analyzed vector by vector along the periphery 257 and for each vector the grid blocks touched are computer 261, and their ingrid values set to True 263.

Figure 25:
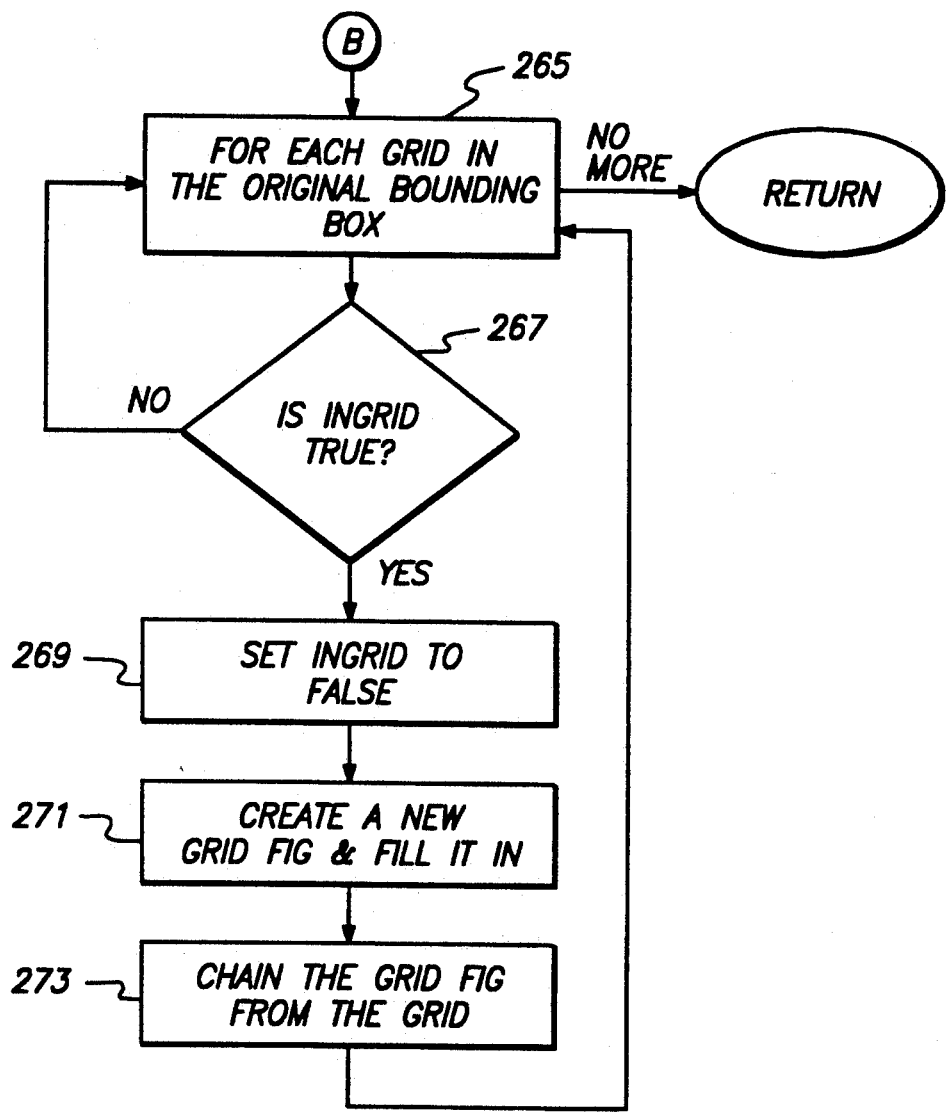

After the ingrid values are set to True for each large rectangle (and for each vector if not a rectangle), then, as illustrated in the flow chart of FIG. 25, each grid black is tested 267 for whether its ingrid value is True. If True, the ingrid value is set to False 269 (i.e., turned off for later use), a new grid record is created 271, and the record is "chained" with those records of other FIGS. 273 in the same grid.

Figure 26:
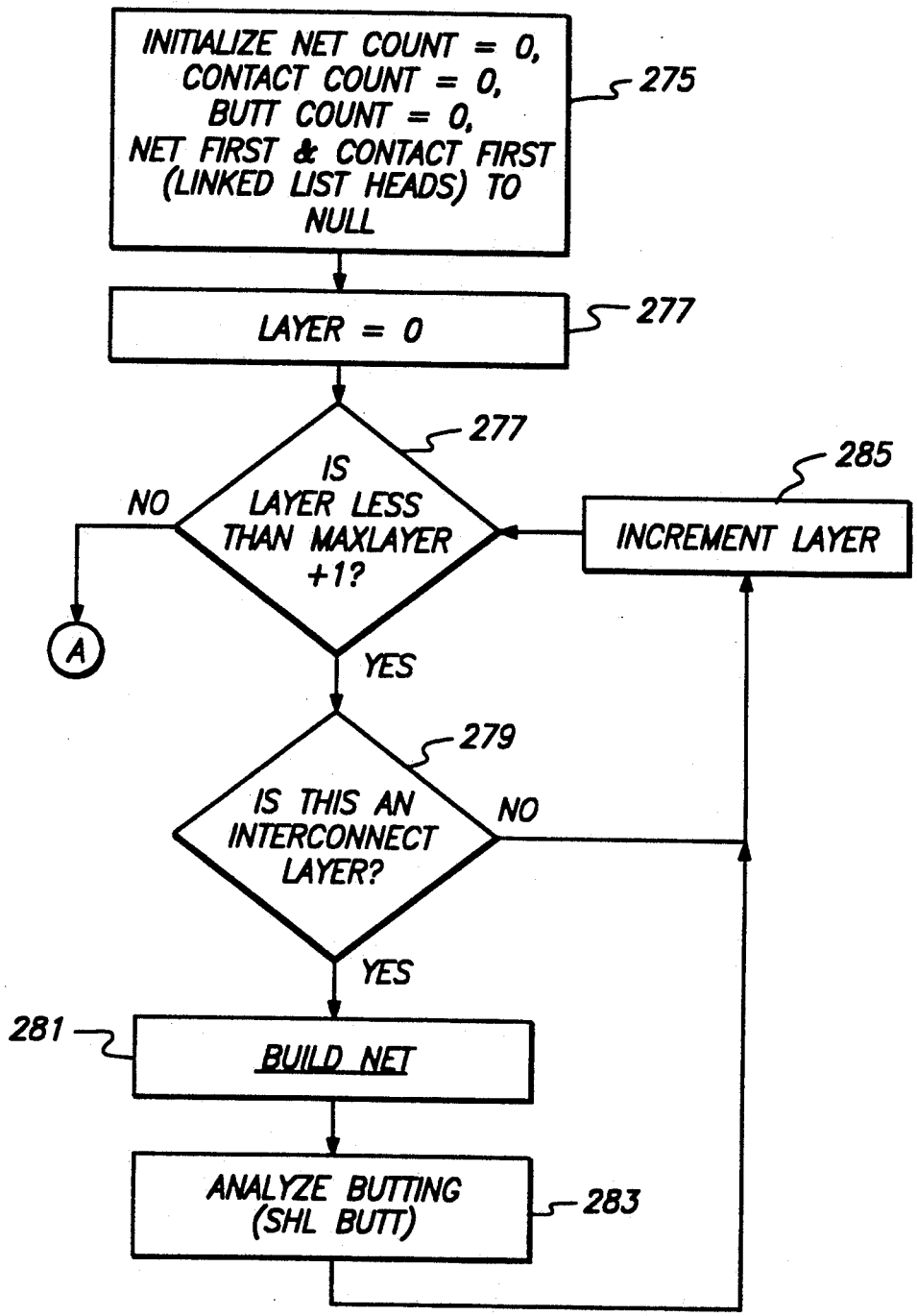
FIGS. 26 and 27 comprise a flow chart illustrating the BUILD routine for operation during problem node analysis whether for multi-polygon or high resolution operation, according to the present invention.
Figure 27:
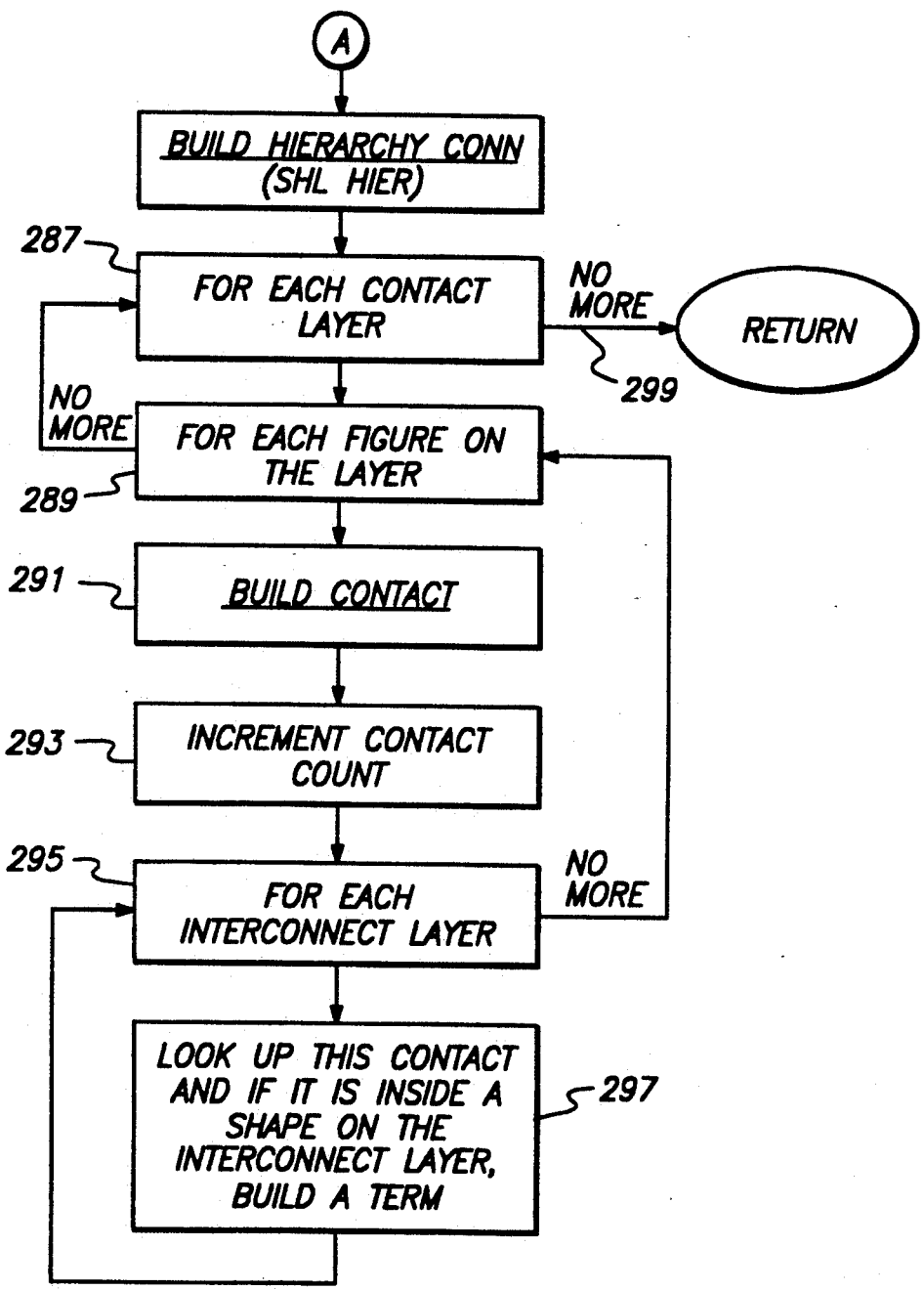

Referring now to FIG. 26, there is shown a flow chart illustrating the BUILD process according to the present invention. At the start of the process 275 the net count and contact count are set to zero, the butting polygon is set to zero and the First Net and First Contact values (linked list heads) are set to null. Layer number is then set to zero 277. If layer number is less than the maximum layer number plus 1 (277), then a test is made to determine whether this layer is an interconnect layer 279 and if it is, then the Build Net routine is executed 281 for that layer and the butting polygon analysis is performed 283 prior to incrementing the layer 285 and repeating the process until all layers are done; i.e., step 227 is False. Next, any macrocell connections are extracted, as illustrated in the flow chart of FIG. 27. Next, for each contact layer 287 and for each figure the routine Build Contact is executed 291 to form a contact for each figure on the layer and "Contact Count" is correspondingly incremented 293 by 1. For each interconnect layer 295, if this contact is within a shape on that layer, then the routine Build Terminal is executed 297 for that interconnect layer for each contact overlapping the layer.

Referring now to FIG. 28, there is shown a flow chart of the BUTT routine that is called for execution once for each interconnect layer. Specifically, a counter called "grid" is initially set to zero 301, then after each grid block is studied, "grid" is incremented and compared with the known number of grid blocks (grid count) to determine whether all grids have been analyzed 303. If not, then the next figure is retrieved 305 for this layer and grid block, after which the next figure is retrieved 307 to determine 309 whether the shapes of figures A and B intersect. If so, the intersect routine is called for execution, and if they intersect, a contact line and two terminals are formed and the butt count is incremented 313. When there are no more intersecting figures on this layer and grid block, the variable "grid" is incremented 315 until all grids are completed 317.

Referring now to FIG. 29, there is shown a flow chart of the TRIG routine used to display short locator results to a user. Specifically, whenever the remaining ambiguities are to be displayed, this routine generates representations of the inactive net parts 321, the inactive isolated net parts 323, and the active net 325 and contacts parts of the problem node 327. Then, an active isolated net is generated 329, the isolated contacts are generated 331, and the labels are generated 333 for display. Each of the aforementioned 'generate' passes goes through the internal data structures and displays the selected items, where the selection is determined by the active flags, set on a layer-by-layer basis. Also, the net and contact beads have a 'display' flag that is set in the traversal routine to display the current ambiguous portions of the node under examination.

Various other routines referred to herein may be performed in conventional manner, including UTIL to initialize layer arrays of data, and to free up allocated memory and purge accumulated data following a session. Also, a SAVE routine may be used to write the information for a later restart to a disk file, and may write general information and text labels from before and after a switch to high resolution mode of operation. A RESTORE routine may conventionally read all such SAVE data from disk, and can be used to build up the requisite data structures for a session. The LOAD NET HIERarchy routine is used in a conventional manner to extract connectivity information for a hierarchy and to build up a data structure that represents all of the pins that are referred to in an electrical net. This routine may search for multiple pins with the same net number, and builds up contacts and terminals to represent interconnections. A DEBUG routine may be used in conventional manner to debug erroneous results at various operating stages, and may be designed to display any figure from the interconnect layers that is covering a given point. A PINS routine conventionally extracts the connection pins and names from the circuit being analyzed to use such pins as starting points for the analysis. A LOOKUP TEXT routine conventionally goes through a list of labels and starting points and looks them up in the figure list for the layer this text pertains to, and marks the net associated with the figure as being a correspondence point. A conventional routine designated DELETE LABEL is given a point to scan for and searches through the bounding boxes of all the text lists, and for any matches, deletes the label information and resets the initial net status to Failure rather than the correspondence point it was set to. A conventional routine ADD LABEL is given a point and a text string and searches through the figures on all of the active interconnect layers to determine if the point is within one. If not, a flag is set to indicate that there was no net at that location, and if a figure is found, the figure is tested to determine if the figure doesn't already have a different name, and to mark the net as a correspondence point. A routine EXTRACT TEXT conventionally goes through all text on all text layers, and for each string checks if it is inside a figure on a specified interconnect layer, and if so, marks the net as a correspondence point. An INPOLY routine includes DETERMINE INT. routine that operates on a point and a vector to determine if a line from coordinates $(-\infty,Y)$ to $(X,Y)$ intersects the vector to return an indication of the type of intersection, if any, as none, on line, crosses, end point, or coincidence. The INPOLY routine also includes POINT IS IN POLYGON routine that conventionally operates on a point and a polygon to determine whether the point is within the periphery of the polygon. A routine INSECT operates in conventional manner on two figures to set a flag indicating whether the two figures intersect, and if so, identifies the intersecting lines. For rectangles, the bounding boxes of the figures are compared, and for other figures the vectors of one figure are checked for intersection with the vectors of the other figure. The PARSE routine operates in conventional manner to retrieve connectivity information that was stored for a circuit layout of nodes and nets, and creates an internal data structure that indicates what layers are interconnect layers, and what layers are contact and text layers, and flags interconnect layers that are connected by a contact, and that are marked by a text string. The SPLIT routine previously described operates on a chain of figures by adding each figure as a data representation into an internal memory. If the figure is not a rectangle, the routine checks for clockwise or counterclock-wise polygon and reverses the points to clockwise polygon if a counterclock-wise polygon is found. Then the directions at each vector are calculated and the splits are performed to form pieces which are added or chained as connected. Then, the internal memory representations are transformed back to normal figure representations. The internal data structure is a linked list of the polygons, and for each polygon, there is a polygon header, and chained from each such header is a linked list of polygon vectors. The split execution initializes a flag to the horizontal vector direction to split the polygon horizontally from a peripheral corner, and then proceeds through a chain of polygons, splitting each polygon and adding the pieces to the list for further splitting, as necessary to resolve ambiguities of a node. The flag may be set to vertical to split the polygon along a vertical line from a peripheral corner. If that split succeeds, the flag is set to horizontal, and if successful, to vertical in an alternating horizontal and vertical succession of split vectors from sequential peripheral corners of the polygon. The split count is also incremented. For each split vector from a point, the closest intersection along the vector of a peripheral boundary of the polygon is found and the polygon is split on that vector. Otherwise, the result is false. The rest of the polygon successfully split is returned to the list for further splitting, if necessary. The split polygons are considered butting polygons and will be considered as connected for further processing, as previously described.

The TRAVER routine previously described may be more fully described as follows:

Init for Traversal
    For each net, set visited to FALSE
        set contact Previous to NULL
    If Not Pass 2, if the stat is not correspondence point
        set state to FAILURE
    For each contact, set visited to FALSE
        set net Previous to NULL
    If not Pass 2, if the stat is NOT a correspondence point
        set stat to FAILURE
    For each term, set "taken flag "to FALSE
Init Cumulative Stats
    For each net, copy stat to cumulative stat
    For each contact, copy stat to cumulative stat
Update Cumulative Stat
    For each net
        If stat is SEARCH, set cumulative stat to AMBIGUOUS
        If stat is SUCCESS
            if cumulative stat is SUCCESS
                set cumulative stat to AMBIGUOUS
            else if cumulative stat is FAILURE
                set cumulative stat to SUCCESS
    For each contact
        Do the same as above
Traverse from this net
    Set current mode to SEARCH
    Mark this net as VISITED
    Input from (E) → If stat of this net is not SEARCH
        Set current stat to stat from this net
        If current stat is correspondence point, set current stat to SUCCESS
    Move to Contact if Possible
    If there was no contact, backup to contact
    If still no contact, return from this routine
    If stat of the contact is not SEARCH
        Set current stat to stat from this contact.
        If current stat is correspondence point, set current stat to SUCCESS
    Input from (X) → Move to Net if possible
    If no Net, go to (D)
    If stat of this net is not SEARCH
        Set current sat to stat from this net -continued

```
        If current stat is correspondence point set
            current stat to SUCCESS
        If net stat is a correspondence point for the net
        we are traversing
            IF pass = 1
                Mark Success Path
                    Go to (D)
                Else if stat is not another
                correspondence point
                    Go to (D)
                Else set current Mode to FAILURE
                    Backup to Contact
                    Move to (X)
        Input from (d) → If we don't have a current net
        8/15 Backup to Net
            Move to (E)
    Mark Success Path
        Input from (Y) → From the current net, get the
        contact from the previous contact field
        Set stat of that contact to SUCCESS
        Set net to the previous net field of the contact
        If the stat of this net is correspondence point
            → Return
        Set stat of this net to SUCCESS
            Move to (Y)
    Move to Contact (from a Net)
        Point to this first term for this net
        Input from (L) → Set contact to = contact Term
        Owner from the term
        If contact was pruned
            Move to (K)
        If term was taken
            Move to (M)
        Mark term as taken
        Point to next terminal for this net
        If there is a next terminal
            Move to (L)
        Input from (M) → If we don't have a term, return
        NULL for the contact
        Mark this term as taken
        Set the previous net field of this contact to the
        starting net
        Mark the contact as visited
        If Pass is 1
            Set current mode to SEARCH
            If stat of the contact is FAILURE
                Set stat of the contact to SEARCH
        RETURN this contact
    Move to Net (from a contact)
        Point to the first term for this contact
        Input from (P) → Set net to net Term Owner from
        the term
        If net was pruned
            Move to (N)
        If term was taken
            Move to (N)
        If contact previous of this net is NULL
            Move to (O)
        Mark term as taken
        Input from (N) → Point to the next terminal for
        this contact if this is a next terminal
            Move to (P)
        Input from (O) → If we don't have a term, return
        NULL for the net
        Mark this term as taken
        Set the previous contact field of this net to the
        starting contact
        Mark the net as visited
        If the pass is 1
            Set current mode to SEARCH
            If stat of the net is FAILURE
                Set stat of the net to SEARCH
        Return this net
    Backup to Contact (from a net)
        Set contact to the previous contact field of the
        net
        Set the previous contact field of the net to NULL
        If Pass 2 = and that state from the net is SEARCH
            Set state of the net to current stat
            increment num status changed
        If the contact is not NULL
            If pass = 1 and stat in the contact is
            SEARCH and current Mode is FAILURE
                Set stat in the contact to FAILURE
        Return the contact
    Backup to Net (from a contact)
        Set net to the previous net field of the contact
        Set the previous net field of the contact to Null
        If pass = 2 and the stat from the contact is
        SEARCH
            Set state of the contact to current stat
            increment num status changed
        If the pass = 1 and the stat in the net is SEARCH
        and current mode is FAILURE
            Set stat in the net to FAILURE
        Return the net
```

What is claimed is:

1. A computer implemented method for analyzing an electrical node of a circuit layout to locate erroneous connections thereon, the method comprising the steps of:

forming a representation of the area of an electrical node including the erroneous connections therein for analysis;

segregating the area of the electrical node into a plurality of individual polygons oriented in contiguous array within said area wherein said step of segregating includes the substeps of:

identifying all obtuse angles along the perimeter of the area of the electrical node including the erroneous connections therein; and forming alternate substantially horizontal and vertical divisions of the area of the electrical node at the locations of the obtuse angles in selected sequence along the perimeter of said area to form thereby a plurality of individual polygons in contiguous array; and analyzing each individual polygon for proper connection to a contiguous polygon commencing from an initial starting point on a polygon within the area of the node.

2. The method according to claim 1, wherein for any individual polygon, obtuse angles are identified; and substantially horizontal and vertical divisions are formed in alternate array along the perimeter thereof at the locations of the identified obtuse angles to form thereby a plurality of individual subpolygons in contiguous array with each other and with other individual polygons within the area of the electrical node.

3. The method according to claim 1, wherein the step of forming a representation comprises the steps of:

retrieving connectivity information for said circuit layer, including information pertaining to the number of layers in said circuit layout and interconnections between said layers; and generating an internal data structure for holding said connectivity information.

4. The method according to claim 1, wherein the step of analyzing each individual polygon includes the step of designating a plurality of said polygons as reference points which are associated with at least two different electrical nodes.

5. The method according to claim 4, further comprising the step of:

removing from a set of polygons to be analyzed any polygon which is not a reference point and which initially is connected to two or fewer other polygons.

6. A computer implemented method for analyzing an electrical node of a circuit layout to locate erroneous connections therein, the method comprising the steps of:

forming a representation of the area of an electrical node including the erroneous connections therein for analysis;

identifying a plurality of reference points in the area of the electrical node which are associated with at least two different electrical nodes;

forming a plurality of contiguous polygons along and within the area of the electrical node at least between said reference points;

traversing a sequence of polygons from one reference point toward another reference point on the electrical node to determine electrical connection of each polygon to an adjacent polygon previously traversed in the sequence, and storing the results of the determination for each polygon along the course of another reference point;

designating success of connections in the stored results under conditions of the sequence proceeding between two reference points associated with the same electrical node, and designating failure of connections in the stored results under conditions of the sequence proceeding between two reference points associated with different electrical nodes; and displaying a representation of at least a portion of the sequence of polygons for which the stored results designate failure between two reference points.

7. The method according to claim 6 wherein the step of traversing includes traversing forward in the sequence of polygons newly encountered and designating any polygon associated with a junction to another electrical node, and traversing backward in the sequence of polygons upon condition of encountering a reference point associated with another electrical node, the backward traverse continuing from such another reference point at least to a polygon associated with a junction to designate the polygons in the backward traverse as failures of connections; traversing forward from the junction polygon along another sequence of polygons toward another reference point with designations of success of connections in the stored results for each polygon between the junction polygon and a reference point associated with the same electrical node; and displaying at least a representation of the junction polygon.

* * * * *